US009869453B2

United States Patent
Samonji et al.

(10) Patent No.: US 9,869,453 B2
(45) Date of Patent: Jan. 16, 2018

(54) LIGHT SOURCE, LIGHT SOURCE UNIT, AND LIGHT SOURCE MODULE USING SAME

(71) Applicant: Panasonic Intellectual Property Management Co., Ltd., Osaka (JP)

(72) Inventors: Katsuya Samonji, Toyama (JP); Kazuhiko Yamanaka, Toyama (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 277 days.

(21) Appl. No.: 14/800,736

(22) Filed: Jul. 16, 2015

(65) Prior Publication Data

US 2015/0316234 A1 Nov. 5, 2015

Related U.S. Application Data

(63) Continuation of application No. PCT/JP2013/004547, filed on Jul. 26, 2013.

(30) Foreign Application Priority Data

Jan. 24, 2013 (JP) .................................. 2013-010993

(51) Int. Cl.
*F21V 13/04* (2006.01)
*H01S 5/40* (2006.01)
(Continued)

(52) U.S. Cl.
CPC ................ *F21V 13/04* (2013.01); *F21V 5/04* (2013.01); *F21V 9/16* (2013.01); *G02B 19/0028* (2013.01);
(Continued)

(58) Field of Classification Search
CPC ... F21V 13/04; F21V 5/04; F21V 9/16; G02B 19/0028; G02B 19/0057; G02B 27/0961;
(Continued)

(56) References Cited

U.S. PATENT DOCUMENTS

2003/0048819 A1 3/2003 Nagano et al.
2010/0328633 A1 12/2010 Sato et al.
(Continued)

FOREIGN PATENT DOCUMENTS

JP 2003-158332 5/2003
JP 2011-013317 1/2011
(Continued)

OTHER PUBLICATIONS

International Search Report of PCT application No. PCT/JP2013/004547 dated Oct. 15, 2013.

*Primary Examiner* — Laura Tso
(74) *Attorney, Agent, or Firm* — McDermott Will & Emery LLP

(57) ABSTRACT

Provided are a light source, a light source unit, and a light source module that have small sizes, high output, and high coupling efficiency with an optical system, and further, can efficiently dissipate heat generation sources to exhaust heat. In the light source unit of the present disclosure, the light source is a semiconductor laser array. This configuration can realize high output of the light source, and high output of the whole light source unit. The light source unit includes a lens that converts outgoing beams to parallel beams, and an optical element having a plurality of optical surfaces with different minute inclination angles with respect to a principal surface. The minute inclination angles of the plurality of optical surfaces that intersect with optical rays of the plu-
(Continued)

rality of outgoing beams passing through a principal point of the lens are opposite to one another with respect to the principal surface.

14 Claims, 18 Drawing Sheets

(51) Int. Cl.
*F21V 5/04* (2006.01)
*F21V 9/16* (2006.01)
*G03B 21/20* (2006.01)
*G02B 19/00* (2006.01)
*G02B 27/09* (2006.01)
*H01S 5/00* (2006.01)

(52) U.S. Cl.
CPC ..... *G02B 19/0057* (2013.01); *G02B 27/0961* (2013.01); *G02B 27/0983* (2013.01); *G03B 21/208* (2013.01); *G03B 21/2013* (2013.01); *G03B 21/2033* (2013.01); *G03B 21/2066* (2013.01); *H01S 5/4025* (2013.01); *H01S 5/005* (2013.01); *H01S 5/0071* (2013.01); *H01S 5/4031* (2013.01); *H01S 5/4093* (2013.01)

(58) Field of Classification Search
CPC ............ G02B 27/0983; G03B 21/2013; G03B 21/2033; G03B 21/2066; G03B 21/208; H01S 5/4025; H01S 5/005; H01S 5/0071; H01S 5/4031; H01S 5/4093
USPC .......................................................... 362/84
See application file for complete search history.

(56) References Cited

U.S. PATENT DOCUMENTS

| 2012/0229775 | A1 | 9/2012 | Itoh et al. |
| 2012/0320561 | A1 | 12/2012 | Nozaki et al. |
| 2014/0111775 | A1* | 4/2014 | Nishikawa ......... G03B 21/2013 353/31 |
| 2014/0375960 | A1* | 12/2014 | Mochizuki ............ G02B 6/122 353/31 |

FOREIGN PATENT DOCUMENTS

| JP | 2011-071391 | 4/2011 |
| JP | 2012-190544 | 10/2012 |
| JP | 2013-004847 | 1/2013 |

* cited by examiner

LIGHT SOURCE, LIGHT SOURCE UNIT, AND LIGHT SOURCE MODULE USING SAME

BACKGROUND OF THE INVENTION

1. Field of the Invention

The present disclosure relates to a light source, a light source unit and a light source module having large optical output for use in a display such as a projector, welding and processing devices, and the like.

2. Description of the Related Art

A light source has been developed that radiates beams having very high energy whose optical output exceeds 1 watt. Particularly, the light source that efficiently radiates beams excellent in directivity has been considered in various applications. As the above-described light source that radiates the beams excellent in directivity, cited is a semiconductor light-emitting device represented by a semiconductor laser, in which a semiconductor light-emitting element with an optical waveguide is mounted on a package or the like. For example, an InAlGaP-based or InAlGaAs-based compound semiconductor or the like is used as a material of the semiconductor light-emitting element. The semiconductor light-emitting device using this semiconductor light-emitting element has been developed in applications of light sources of industrial processing devices such as a welding device, a processing device, a laser scribing device, a thin-film annealing device and the like, a long-wavelength light source of a display, and other light sources. Moreover, an InAlGaN-based nitride semiconductor or the like is used as the material of the semiconductor light-emitting element. The semiconductor light-emitting device using this semiconductor light-emitting element has been developed as a light source of an image display device such as a laser display and a projector, and a light source for an excitation light source unit of a white solid-state light source. For example, a light source module in which the light source as the semiconductor light-emitting device is used as an excitation light source to be combined with a phosphor can emit white light having high optical output. Thus, the development of the above-described light source module has been advanced for a projection type image display device such as a projector.

It is desirable that these light sources and the light source units radiate beams exceeding, for example, several ten watts as the optical output. Thus, for a structure to release heat generated in the light source, and a structure to efficiently radiate the beams radiated from the light source to an outside of an optical system, various contrivances are necessary.

With regards to the above-described problem, for example, Patent Literature 1 has proposed a structure of a light source unit in which a plurality of light sources are combined. Hereinafter, referring to FIG. 18, a conventional light source unit will be described. Light source unit 1000 is made up of light source group 1010 and first reflecting mirror group 1020 that is disposed on optical axes of light source group 1010. Light source group 1010 includes a plurality of light sources 1001 that are arrayed in a plane so as to form rows and columns. First reflecting mirror group 1020 reflects a bundle of rays emitted from light sources 1001 making up the respective rows of light source group 1010 as a bundle of rays whose cross-sectional area is reduced in the columnar direction by narrowing row intervals of the bundle of rays emitted from light sources 1001. Light sources 1001 are made up of a plurality of semiconductor laser elements 1005, and a plurality of collimator lenses 1007 that converts beams generated by the laser elements to parallel beams. First reflecting mirror group 1020 is made up by disposing, in a stepwise shape, strip-like reflecting mirrors 1025 different from one another on optical axes of the bundle of rays emitted as parallel beams from the respective rows of light source group 1010. Respective reflecting mirrors 1025 are disposed so as to reduce intervals between reflected beams from reflecting mirrors 1025, which can reduce the cross-sectional area of the bundle of rays. Moreover, since a plurality of luminous fluxes generated from the plurality of semiconductor laser elements 1005 are parallel to one another, they can be condensed by a small optical system to be used.

CITATION LIST

Patent Literature

PTL 1: Unexamined Japanese Patent Publication No. 2011-013317

However, in conventional light source unit 1000, when the optical output is tried to be increased, a number of the light sources is increased because optical output increase of the light sources is limited, so that a size of the light source unit is increased. This poses a problem that coupling efficiency with the optical system at a subsequent stage is deteriorated, and the like.

SUMMARY OF THE INVENTION

An object of the present disclosure is to provide a light source, a light source unit, and a projection type image display device that have small sizes, high output, and high coupling efficiency with an optical system, and further, can distribute heat generation sources to exhaust heat efficiently.

In order to solve the above-described problem, a light source unit of the present disclosure includes a light source having a plurality of light-emitting points, and configured to radiate outgoing beams in an identical direction and with a predetermined spread angle from the respective plurality of light-emitting points, a collimator lens configured to transmit the outgoing beams, and an optical element including incident surfaces having different inclination angles with respect to a principal surface for the respective plurality of outgoing beams.

With this configuration, the beams generated from the plurality of light-emitting points can be collimated, and further, a plurality of luminous fluxes in each of which the beams are collimated can be collimated with each other.

Preferably, in the light source unit of the present disclosure, the incident surfaces are inclined to a side of the light source with respect to the principal surface.

Preferably, in the light source unit of the present disclosure, optical axes of the plurality of outgoing beams have a predetermined angle difference after the plurality of outgoing beams pass through the lens, and the inclination angles are half of the predetermined angle difference.

Preferably, in the light source unit of the present disclosure, furthermore, the principal surface has an angle of 45 degrees with respect to the optical axes, and the plurality of incident surfaces reflect the outgoing beams.

Preferably, in the light source unit of the present disclosure, furthermore, the optical element has a plurality of mirrors each including the incident surface.

Preferably, in the light source unit of the present disclosure, furthermore, the optical element transmits the outgoing beams, and the incident surfaces are inclined so as to be convex to a side of the optical element with respect to the principal surface.

Preferably, in the light source unit of the present disclosure, furthermore, the principal surface is perpendicular to the optical axes, and the plurality of incident surfaces transmit the outgoing beams.

Preferably, in the light source unit of the present disclosure, furthermore, the light source radiates three outgoing beams of a first outgoing beam, a second outgoing beam, and a third outgoing beam arranged in order in a row, the optical element has a first incident surface, a second incident surface, and a third incident surface for the first outgoing beam, the second outgoing beam, and the third outgoing beam, respectively, and the second incident surface coincides with the principal surface, and the first incident surface and the third incident surface have a predetermined inclination angle with respect to the principal surface.

Preferably, in the light source unit of the present disclosure, furthermore, the optical element is a lens.

Preferably, the light source unit of the present disclosure further includes a package to mount the optical element, and the incident surfaces are included in the package.

Preferably, in the light source unit of the present disclosure, furthermore, the light source is a semiconductor laser array. This preferable configuration can realize high output of the light source, and can realize high output of the whole light source unit.

Furthermore, preferably, in the light source unit of the present disclosure, the principal surface is perpendicular to the optical axes, and the plurality of incident surfaces transmit the outgoing beams. According to the preferable configuration, a luminous flux group in which luminous fluxes are parallel to one another can be obtained without largely changing the outgoing beams from the light source in the outgoing direction.

Furthermore, preferably, in the light source unit of the present disclosure, the principal surface has the angle of 45 degrees with respect to the optical axes, and the plurality of incident surfaces reflect the outgoing beams. According to this preferable configuration, the outgoing directions of the outgoing beams from the laser array serving as the light source are bent at 90 degrees, and the luminous flux group in which the luminous fluxes are parallel to one another can be obtained. Furthermore, density of the luminous flux group can be increased.

Moreover, including the light source unit of the present disclosure can realize a projection type image display device having high luminance.

Preferably, a light source of the present disclosure is a light source having a plurality of light-emitting points and configured to radiate outgoing beams in an identical direction and with a predetermined spread angle from the respective plurality of light-emitting points, wherein an interval between the respective plurality of light-emitting points is 20 μm or more and 120 μm or less. According to this preferable configuration, even when collimated beams are formed by a collimator lens or the like, an optical loss in the collimator lens is small, and a deviation angle of mutual propagation directions can be made sufficiently small.

Furthermore, preferably, in the light source of the present disclosure, the light source is a nitride semiconductor laser array.

This preferable configuration can realize high output of the light source, and can realize high output of the whole light source unit.

According to the configuration of the present disclosure, even when the semiconductor light-emitting element having the plurality of light-emitting points at predetermined intervals such as, for example, the semiconductor laser array is used as the light source, the outgoing beams can be made parallel, and the beams can be radiated in a small region with the simple configuration.

DETAILED DESCRIPTION OF THE PREFERRED EMBODIMENTS

Hereinafter, exemplary embodiments of the present disclosure will be described with reference to the drawings.

First Exemplary Embodiment

Figure 1:
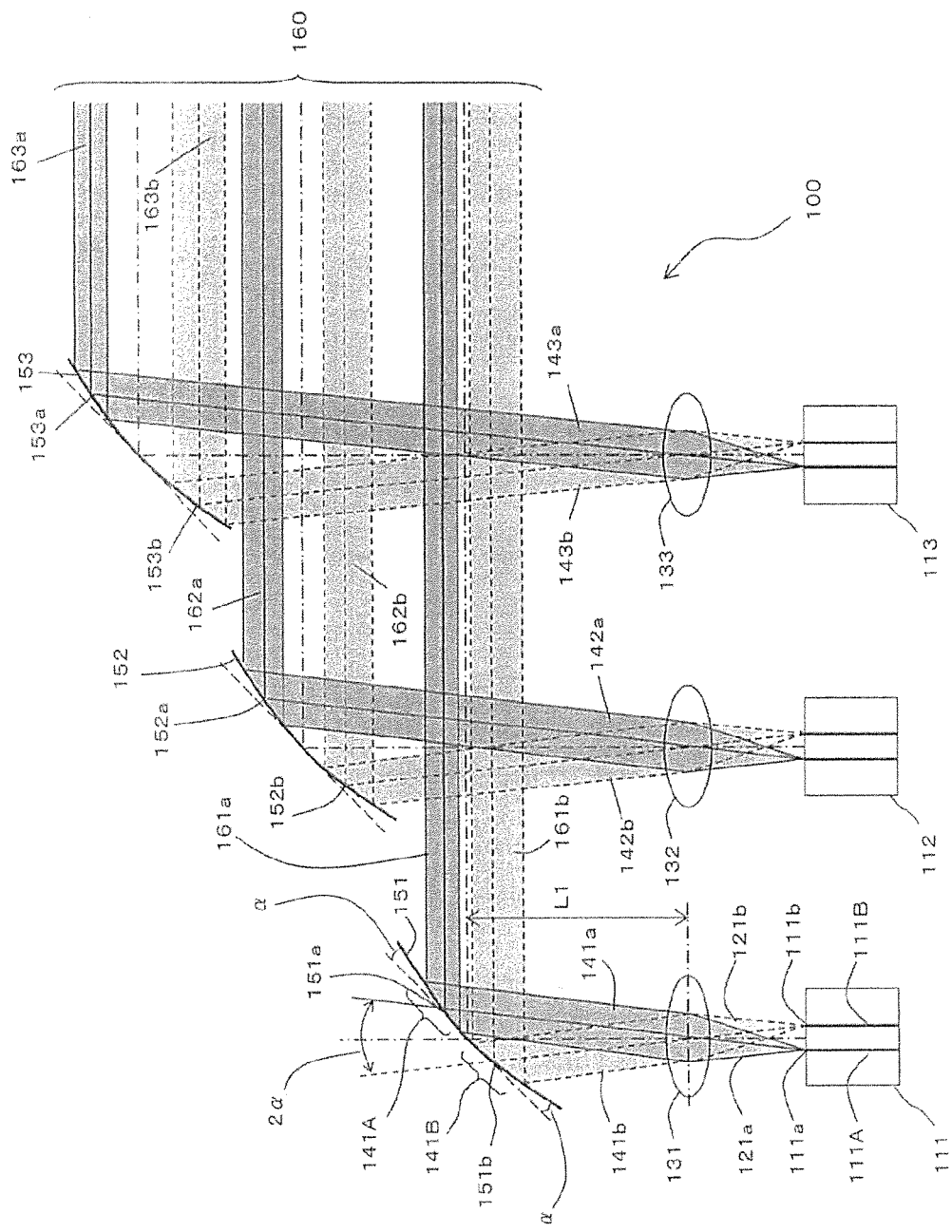
FIG. 1 is a diagram for describing a configuration of a light source unit of a first exemplary embodiment.

FIG. 1 is a configuration diagram of a light source unit as a first exemplary embodiment of the present disclosure. Light source unit 100 is made up of a plurality of light sources 111, 112, and 113, a plurality of collimator lenses 131, 132, and 133, and a plurality of concave reflecting mirrors 151, 152, and 153. Light source 111 is a semiconductor light-emitting element in which two waveguides 111A and 111B are formed on the same substrate to radiate outgoing beams having high directivity from two emitters 111a and 111b, and is, for example, a laser array element.

Here, the light source is not limed to the laser element, but only needs to be a semiconductor light-emitting element that generates beams having directivity sufficient to enable collimating by the collimator lens. For example, a superluminescent diode (SLD) may be used.

Outgoing beams 121a and 121b emitted from emitters 111a and 111b of light source 111 each have a certain spread angle. These outgoing beams 121a and 121b are captured by collimator lens 131 to be converted to collimated beams (parallel beams) 141a and 141b. At this time, propagation directions of two collimated beams 141a and 141b are not parallel. As described later, principal rays of the two collimated beams cause an angle difference of beam deviation angle 2α.

Next, two collimated beams 141a and 141b are bent at an almost right angle by concave reflecting mirror 151 to be emitted from the light source unit as luminous flux group 160. Concave reflecting mirror 151 is installed with an angle of about 45° with respect to an outgoing direction of the beams from light source 111. However, a shape of concave reflecting mirror 151 is concave in accordance with beam deviation angle 2α of two collimated beams 141a, 141b. Specifically, at reflection points 151a, 151b where luminous fluxes 141A, 141B of collimated beams 141a, 141b are reflected, respectively, the reflection surface is inclined at a minute angle, that is, at angle α on a reflection surface side. This configuration can make mutually parallel principal rays of collimated beams 161a and 161b resulting from reflecting collimated beams 141a, 141b at concave reflecting mirror 151. Dashed lines given to concave reflecting mirrors 151, 152, 153 in FIG. 1 each denote a planar surface.

Similarly, with regards to light source 112 and light source 113, concave reflecting mirrors 152, 153 are similarly disposed, the propagation directions of collimated beams 162a, 162b, 163a, and 163b resulting from reflecting collimated beams 142a, 142b, 143a, 143b at reflection points 152a, 152b, 153a, 153b of concave reflecting mirrors 152 and 153 can also be made parallel to one another. As a result, six collimated beams parallel to one another are output as luminous flux group 160 from the light source unit. While in the present exemplary embodiment, the three light sources as semiconductor light-emitting elements are used, four or more light sources can be used.

Figure 2:
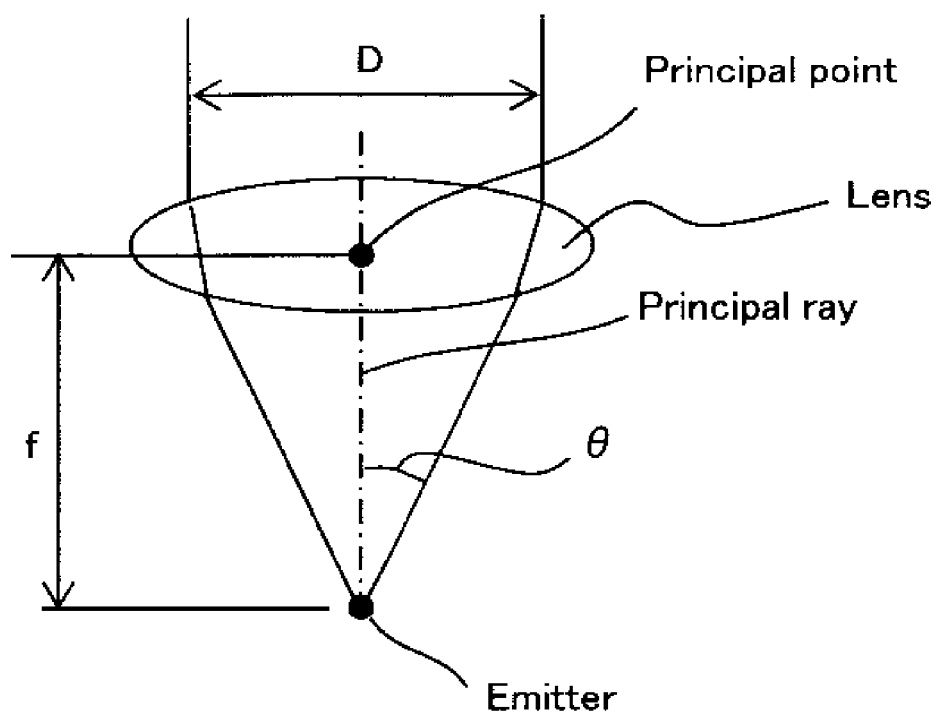
FIG. 2 is a diagram for describing the configuration of the light source unit of the first exemplary embodiment.

Next, referring to FIGS. 2 to 8, the preferred exemplary embodiment will be described, using a specific design of the light source and the light source unit. FIG. 2 schematically illustrates a design of a collimator lens. FIG. 2 shows a relative positional relationship between an emitter (a light-emitting point) and a lens, which is a collimator lens. If a numerical aperture is NA, acceptance angle θ, which is a maximum angle of an incident angle of a beam that enters a pupil of the collimator lens, is represented as follows:

$$NA = \sin \theta \quad (1)$$

Acceptance angle θ is approximately decided by the following expression with pupil diameter D of the lens and focal length f $$\theta = \tan^{-1}(D/(2 \cdot f)) \quad (2)$$

When the semiconductor light-emitting element with one emitter is used, a central axis (the light-emitting point) of the emitter is made coincident with a central axis of the collimator lens, so that the beam of the spread angle smaller than acceptance angle θ is captured by the lens to be converted to a collimated beam. Accordingly, by designing an optical system such that focal length f is made small, and acceptance angle θ is made large, more light can be captured by the lens.

Figure 3:
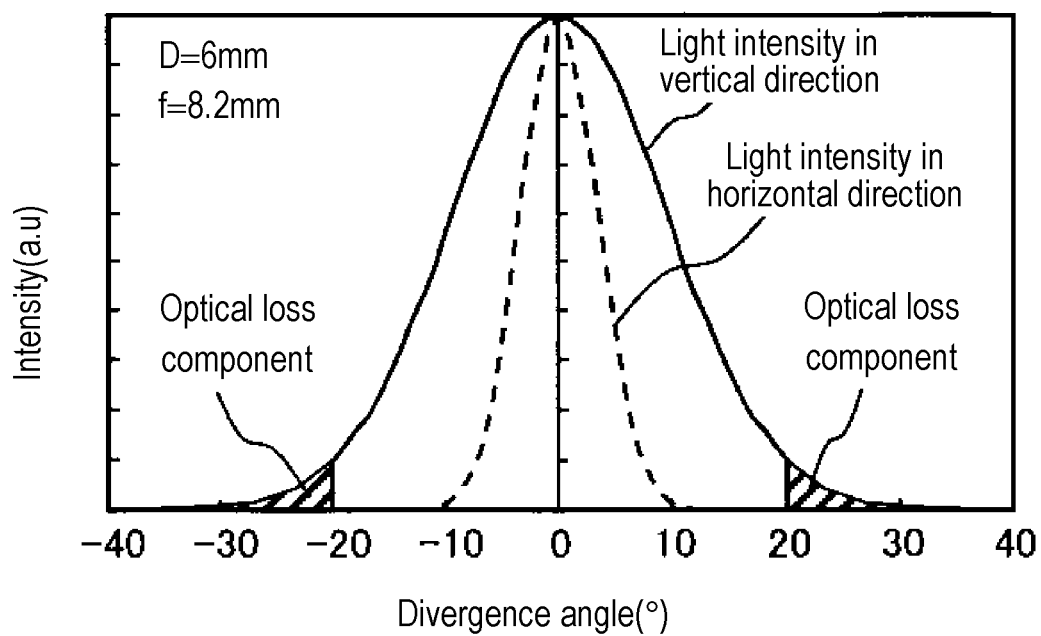
FIG. 3 is a diagram for describing an effect of the light source unit of the first exemplary embodiment.
Figure 4:
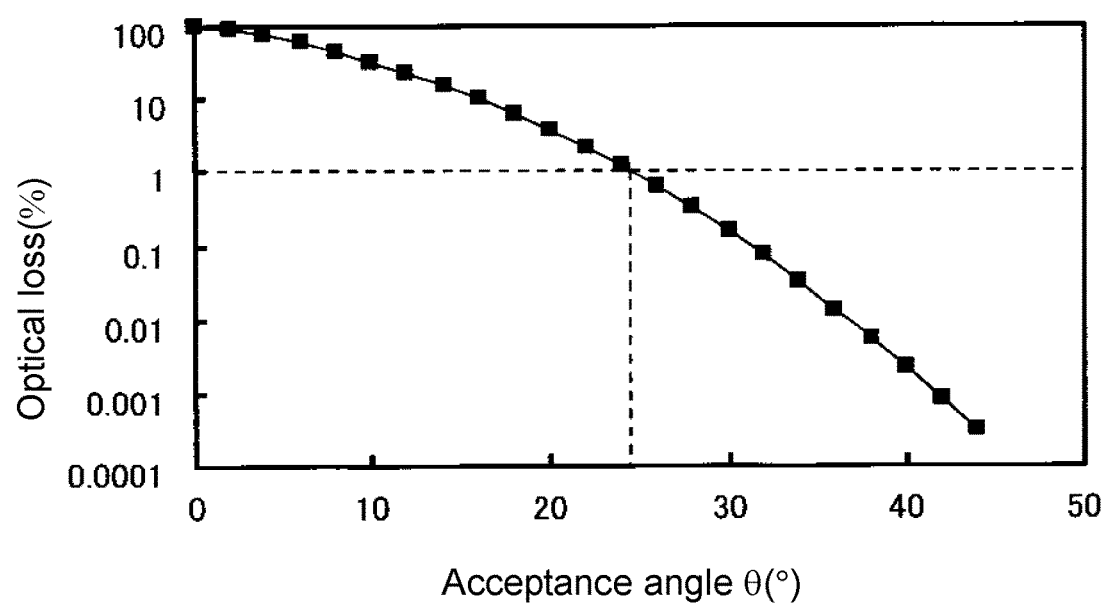
FIG. 4 is a diagram for describing the effect of the light source unit of the first exemplary embodiment.

FIG. 3 shows an angle distribution of outgoing beam intensity of a laser element that the present inventors use as the semiconductor light-emitting element. In FIG. 3, a horizontal axis indicates a light divergence angle (degree (°)), and a vertical axis indicates a light intensity (in an arbitrary unit (a.u.)). Moreover, a solid line indicates a vertical divergence intensity (in a direction perpendicular to a principal surface of an active layer of the semiconductor light-emitting element), and a dashed line indicates a horizontal divergence intensity (in a direction parallel to the principal surface of the active layer of the semiconductor light-emitting element). Here, for example, if effective diameter D of the collimator lens is 6 mm, focal length f is 8.2 mm, acceptance angle θ becomes about 20°. Components (hatched portions in FIG. 3) of the outgoing beam having the spread angle of 20° or more are not captured by the lens, which results in an optical loss. FIG. 4 indicates a relationship between acceptance angle θ of the collimator lens and the optical loss. In FIG. 4, a horizontal axis indicates the acceptance angle (°), and a vertical axis indicates the loss of the beam from the semiconductor light-emitting element by the collimator lens (optical loss). FIG. 4 shows that increasing acceptance angle θ, that is, decreasing focal length f can reduce the optical loss. Moreover, it is desirable that the outgoing beam emitted from the light source passes through the collimator lens as much as possible, and for example, it is desirable that acceptance angle θ is 24° or more to set the optical loss to about 1% or less.

Subsequently, the preferred exemplary embodiment of the semiconductor light-emitting element as the light source will be described. The light sources used in the light source unit and the light source module each require optical output in a high watt class (i.e., the optical output is 1 watt or more). However, the optical output of the semiconductor light-emitting element is limited by a temperature of the semiconductor light-emitting element itself. If an applied current is increased to increase the optical output, heat generation inside the semiconductor light-emitting element is increased, so that the temperature of the semiconductor light-emitting element rises. As a result, inside the semiconductor light-emitting element, a number of electron-hole pairs overflowing from the active layer that generates light emission (overflow of a carrier) is increased, which further promotes the heat generation. As a result, a phenomenon that even if the current is increased, the optical output is not increased, that is, thermal saturation of the optical output is caused. Accordingly, in order to obtain the high optical output, the overflow of the carrier needs to be suppressed.

Consequently, as a method for achieving both high output operation and suppression of heat generation, a laser array structure is effective in which a plurality of waveguides are formed inside one chip, and each of the waveguides functions as an emitter generating a laser beam. In this structure, the optical output can be taken out as a total sum of the optical output of the respective emitters. In other words, since for optical output Pt obtained from the one chip, optical output Po of each of the emitters only needs to be Pt/N, the high optical output can be realized while suppressing the thermal saturation. Here, N is a number of the emitters formed in the chip. Moreover, since the emitters as the heat generation sources are spatially separated from one another, the whole chip can be effectively used as a heat dissipating route, which can suppress the temperature rise of the respective emitters.

Figure 5:
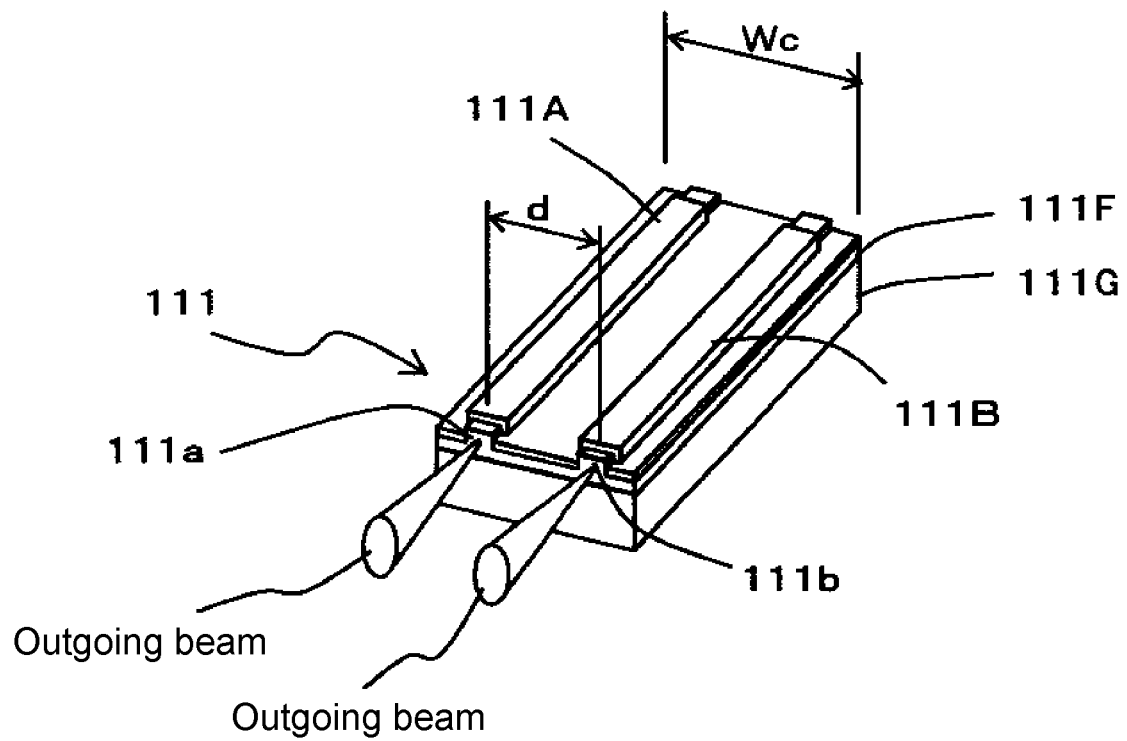
FIG. 5 is a schematic diagram for describing a configuration of a light source of the first exemplary embodiment.

Specifically, referring to a schematic diagram of the light-emitting element used as light source 111 of the present exemplary embodiment shown in FIG. 5, a description will be given. In the present exemplary embodiment, light source 111 is a nitride semiconductor laser element, and the number of the emitters (the number of the waveguides) is two. Specifically, a nitride semiconductor laminated film such as light-emitting layer 111F is laminated on substrate 111G, which is an n-type GaN substrate, and ridge-type waveguides 111A, 111B are formed. The laser beams converted and generated in two waveguides 111A, 111B of light source 111 are emitted as outgoing beams from two emitters 111a, 111b.

In above-described light source 111, it is desirable that an interval between the emitters (emitters 111a and 111b) is as large as possible (emitter interval d is as large as possible), as described above. The emitters and the waveguides formed in the semiconductor light-emitting element are both light-emitting portions and heat generation sources. Accordingly, larger emitter interval d enables the heat generation inside the semiconductor light-emitting element to be dissipated, which facilitates the suppression in the temperature rise of the emitters, thereby bringing about the high optical output.

Figure 6:
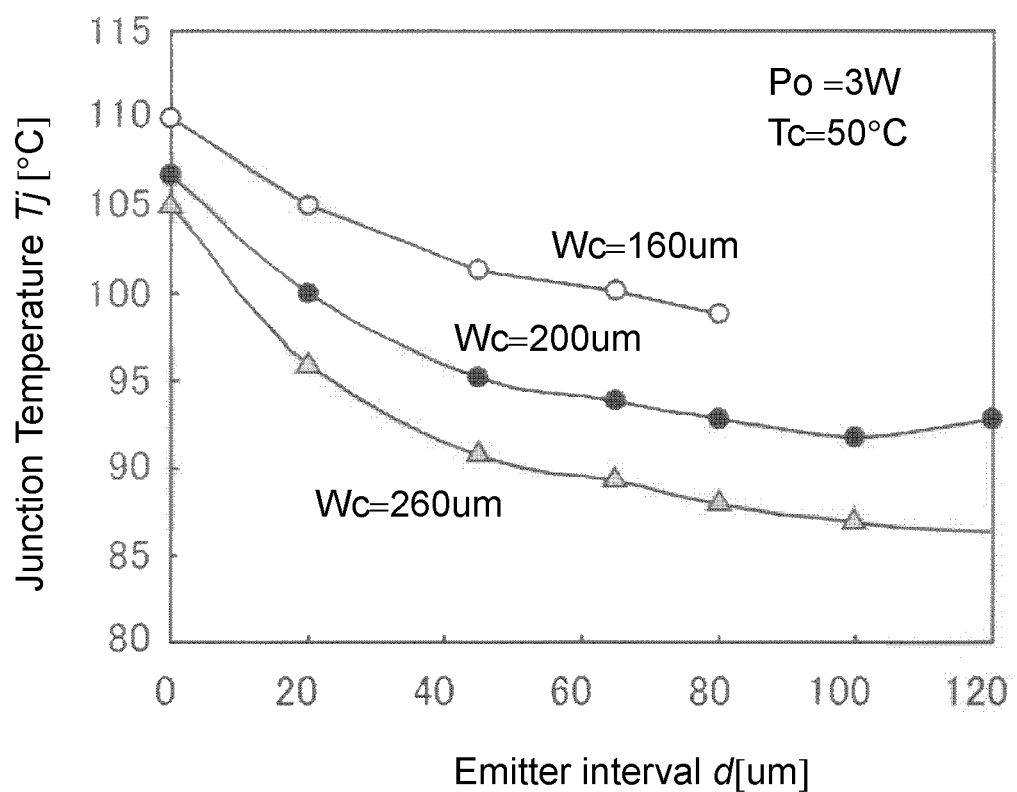
FIG. 6 is a diagram for describing an effect of the light source unit of the first exemplary embodiment.

Specifically, referring to FIG. 6, an effect of heat dissipation will be described. A graph of FIG. 6 results from plotting junction temperature Tj, which is a temperature of the light-emitting layer constituting each of the emitters of the semiconductor light-emitting element, with respect to emitter interval d, based on experiments and calculations, when chip width Wc is changed to 160 μm, 200 μm, and 260 μm in the semiconductor light-emitting element having chip length 800 μm and chip thickness 90 μm mounted on a predetermined package. In FIG. 6, a horizontal axis indicates the emitter interval, and a vertical axis indicates the junction temperature. The emitter interval 0 μm indicates a single emitter. As the configuration of the light source, a configuration is used in which the semiconductor light-emitting element shown in FIG. 5 is mounted on a package shown in FIG. 15, and the optical output (Po) is 3 W and a package temperature (Tc) is 50° C. A result in FIG. 6 shows that increasing emitter interval d in the configuration of the plurality of (two) emitters can lower junction temperature Tj more effectively than increasing chip width Wc in the configuration of the single emitter. That is, the optical output of the light source (the semiconductor light-emitting element) can be effectively increased.

Figure 8:
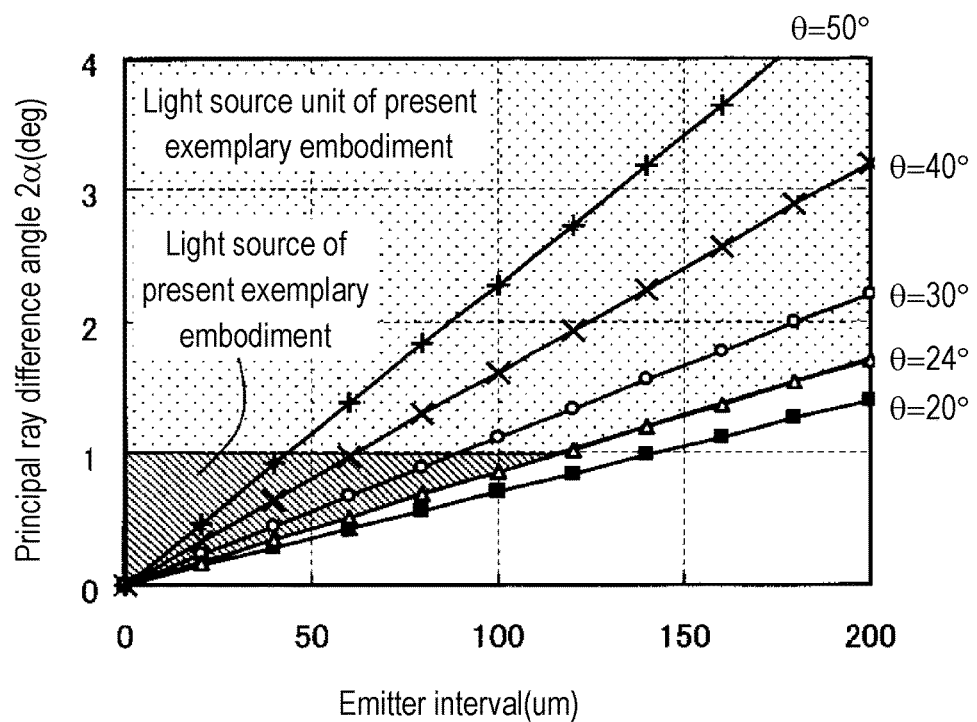
FIG. 8 is a diagram for describing an effect of the light source and the light source unit of the first exemplary embodiment.
Figure 9:
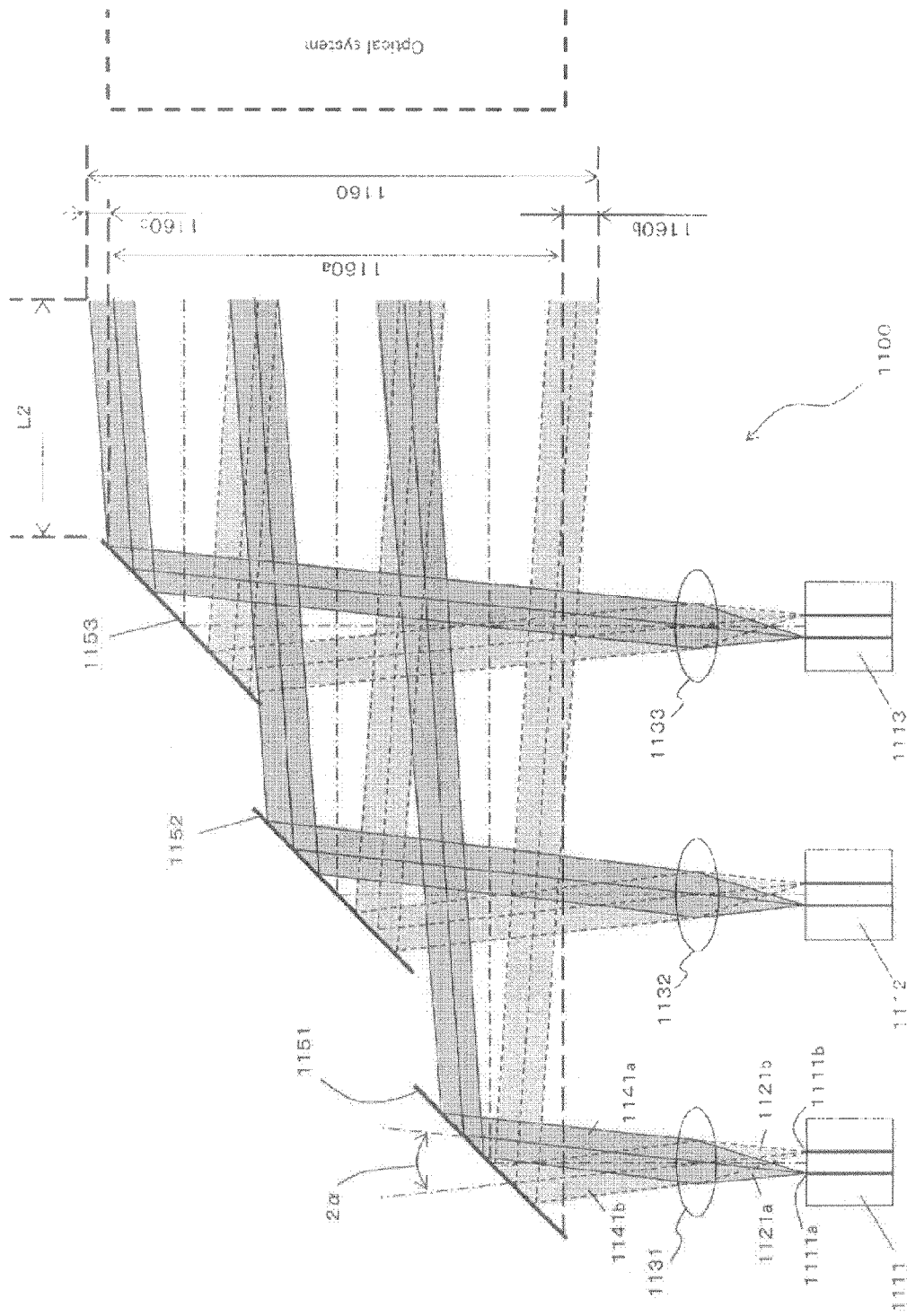
FIG. 9 is a diagram for describing a comparative example for describing an effect of the light source unit of the first exemplary embodiment.

On the other hand, a problem when the light sources each having the two emitters spatially separated by distance d constitute the light source unit will be described with reference to FIGS. 7 to 9.

Figure 7:
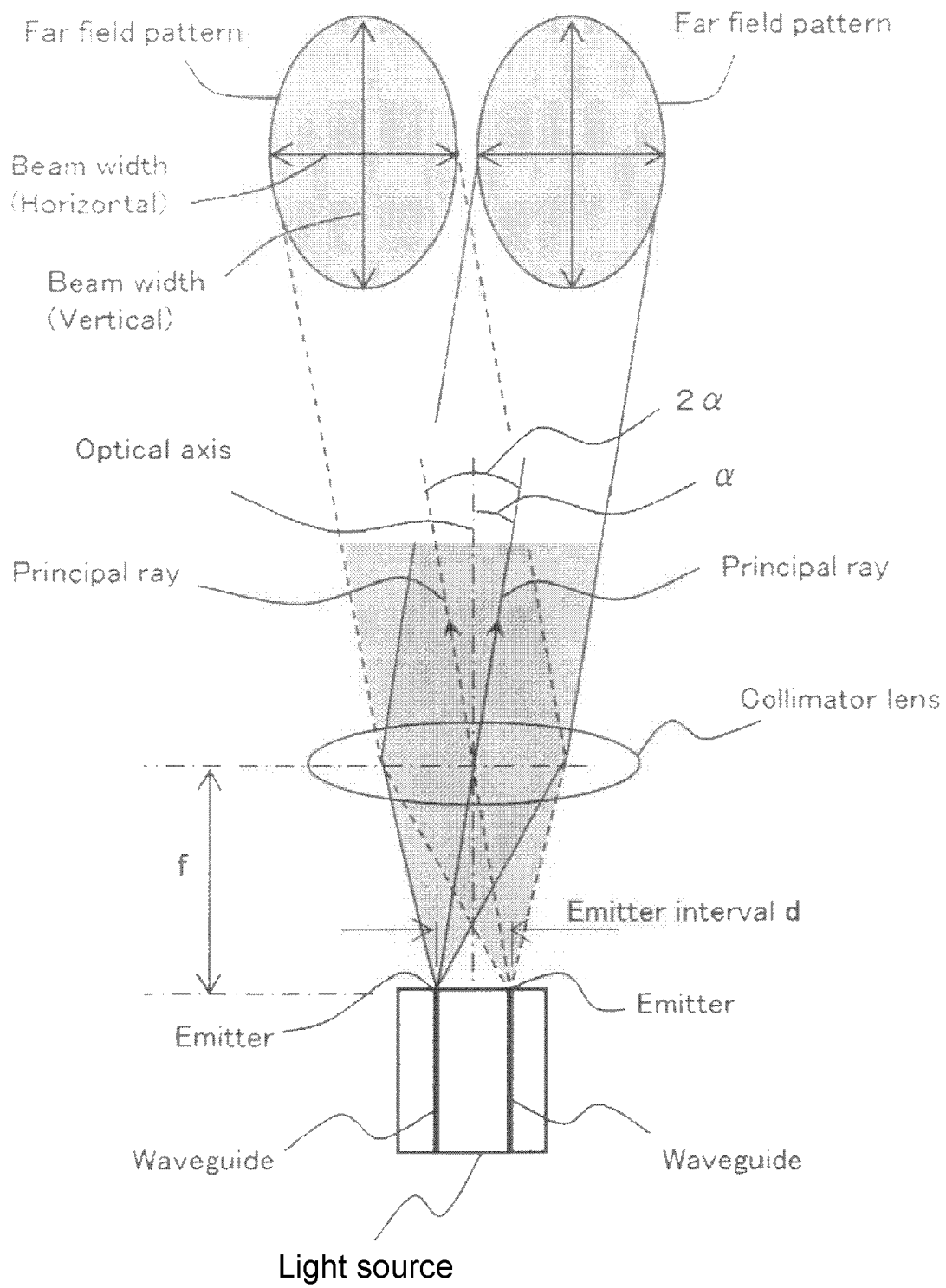
FIG. 7 is a diagram for describing an effect of the light source unit of the first exemplary embodiment.

First, as shown in FIG. 7, a case where the light source having the two emitters generates the collimated beams, using the one collimator lens will be described. Here, the focal distance of the collimator lens is f, and an optical axis is disposed in the middle of the two emitters. In this case, since the two emitters are each separated from the optical axis at a predetermined distance, a principal ray of each of the emitters is deviated from the optical axis by angle $\alpha$ ($=\tan^{-1}(d/(2 \cdot f))$). Accordingly, the two principal rays are deviated by angle $2\alpha$. This angle $2\alpha$ is stored without depending on a position of the optical axis. In the above-described configuration, if a collimator lens with larger acceptance angle θ (smaller focal length f) is used to capture more light, deviation angle $2\alpha$ of the two beams passing through the collimator lens becomes larger. When this angle $2\alpha$ is large, as described below, a light utilization loss in the optical system at a subsequent stage will be increased in the light source unit and the light source module using these collimated beams.

The above-described problem arises similarly when emitter interval d is made larger. FIG. 8 shows a correlation among acceptance angle θ of the collimator lens, beam deviation angle $2\alpha$ after light emission from the collimator lens, and emitter interval d. In FIG. 8, a horizontal axis indicates emitter interval d, and a vertical axis indicates beam deviation angle $2\alpha$ after the light emission from the collimator lens. Referring to FIG. 8, as emitter interval d becomes larger, beam deviation angle $2\alpha$ becomes larger. Further, FIG. 8 shows that when acceptance angle θ is made larger, $2\alpha$ is further increased.

A case where the above-described configuration of the optical system is applied to a configuration of a light source unit will be described, referring to a light source unit of a comparative example shown in FIG. 9.

Light source unit 1100 is made up of light sources 1111, 1112 and 1113 as laser array elements in each of which two emitters are integrated in one semiconductor light-emitting element, collimator lenses 1131, 1132, and 1133, and reflecting mirrors 1151, 1152, and 1153 each having a planar reflection surface. When light source 1111 is focused on, outgoing beams 1121a and 1121b are radiated from two emitters 1111a and 1111b of this light source, respectively. At this time, since emitter 1111a and emitter 1111b are spatially separated at a predetermined distance, principal rays (lines each connecting the emitter and a lens center) of outgoing beams 1121a and 1121b are not parallel to each other. Thus, collimated beams 1141a and 1141b after passing the collimator lens do not become parallel to each other, and enter reflecting mirror 1151 with a predetermined angle (the beam deviation angle). This beam deviation angle is maintained after the beams pass through reflecting mirror 1151. This makes luminous flux width 1160 of the light sources larger than desired luminous flux width 1160a. That is, in a small optical system, a loss is caused in luminous flux width 1160b and 1160c. Further, since the luminous fluxes emitted from this light source unit 1100 become luminous fluxes having an outgoing angle distribution by the beam deviation angle, utilization efficiency of the light in the optical system at the subsequent stage is lowered, so that downsizing of the device becomes difficult, and it also becomes difficult to condense the luminous fluxes radiated from the light source unit.

In order to address the above-described problem, in the present exemplary embodiment, there can be provided a light source and a light unit that are capable of high output of the light source and are high in utilization efficiency of light in an optical system at a subsequent stage.

First, with regards to the light source, as shown in FIG. 4, in order to make the light utilization efficiency of the collimator lens high, for example, in order to obtain the light utilization efficiency excluding surface reflection of 99% or higher, the acceptance angle is set to 24° or more. In this case, in order to keep beam deviation angle $2\alpha$ within 1° inclusive, the emitter interval is set to 120 μm or less. With this configuration, beam deviation angle $2\alpha$ is set to 1° or less, which can sufficiently reduce the loss in optical coupling efficiency in the optical system at the subsequent stage. For example, in the configuration of the optical system shown in FIG. 9, when the intervals of light sources 1111, 1112, 1113 are each 12 mm, and as each of collimator lenses 1131, 1132, 1133, and a collimator lens having pupil diameter D of 6 mm, focal length f of 6.7 mm, acceptance angle θ of 24° is used, beam deviation angle $2\alpha$ becomes 1°. At this time, even when distance L2 between light source unit 1100 and the optical system at the subsequent stage is 30 mm, luminance flux width 1160c is 0.3 mm or less. At this time, since luminous flux width 1160a needs to be at least 18 mm (three times as large as the pupil diameter), luminous flux width 1160c can be made sufficiently small to thereby lower the loss in the light coupling efficiency. The above-described configuration is shown within a range indicated by the light source of the present exemplary embodiment in FIG. 8. In the above-described configuration, as shown in FIG. 6, the emitter interval is set to a range of 20 µm or more, and preferably 40 µm or more, which can effectively reduce the junction temperature, so that the optical output of the light source can be increased.

Moreover, using the light source unit of the present exemplary embodiment can effectively realize high output of each of the semiconductor light-emitting elements, reduction in optical loss of the collimator lens, and collimating of the collimate luminous flux group (reduction in beam deviation angle) by enlarging emitter interval d. Hereinafter, mainly referring to FIG. 1, a description will be given, citing a specific example. Firstly, in each of the semiconductor light-emitting elements as the light sources, sufficient emitter interval d to increase the optical output is specifically set to, for example, 100 µm or more. In the present exemplary embodiment, emitter interval d of the light source is set to 200 µm. Next, lens acceptance angle θ of the collimator lens is set to 24 degrees, which are a level at which the optical loss can be sufficiently lowered, that is, at which the optical loss in the collimator lens is 1% or less. Specifically, in the present exemplary embodiment, lens acceptance angle θ is set to 40 degrees, so that the light utilization efficiency is 99.9% or more. At this time, a specific design of the collimator lens is such that the pupil diameter is 6 mm and the focal length is about 3.6 mm. Beam deviation angle 2α after the beams pass through the collimator lens becomes about 3.2 degrees. The angle of the reflection surface is increased by angle α (1.6 degrees) to a reflection surface side at each of beam reflection points 151a, 151b of concave reflecting mirror 151 shown in FIG. 1. As a result, two collimated beams 161a, 161b after passing through concave reflecting mirror 151 are collimated.

At this time, luminous fluxes 141A, 141B of collimated beams 141a, 141b each have light distribution in a far field pattern having an ellipsoidal beam shape in which a vertical dimension is larger than a horizontal dimension, as shown in FIG. 7. Thus, a distance between a principal point of collimator lens 131 and a center of concave reflecting mirror 151 is set to, for example, 30 mm or more. This configuration can make a distance between the two beam centers larger than 1.5 mm, whereas a beam width in the horizontal direction is about 1.5 mm, and thus, the collimated beams are reflected independently of each other at beam reflection points 151a, 151b, and the angle deviation of collimated beams 161a, 161b are reduced, so that collimated beams 161a, 161b can be made parallel to each other.

With the above-described configuration, luminous flux group 160 in which distribution of the outgoing angle is small, and a size of each of the luminous fluxes is small can be radiated from light source unit 100.

As described above, the configuration of the present exemplary embodiment can realize the light source and the light source unit that have small sizes, high output, and high coupling efficiency with the optical system, and further, can efficiently dissipate heat generation sources to exhaust heat.

Modification of First Exemplary Embodiment

Figure 10:
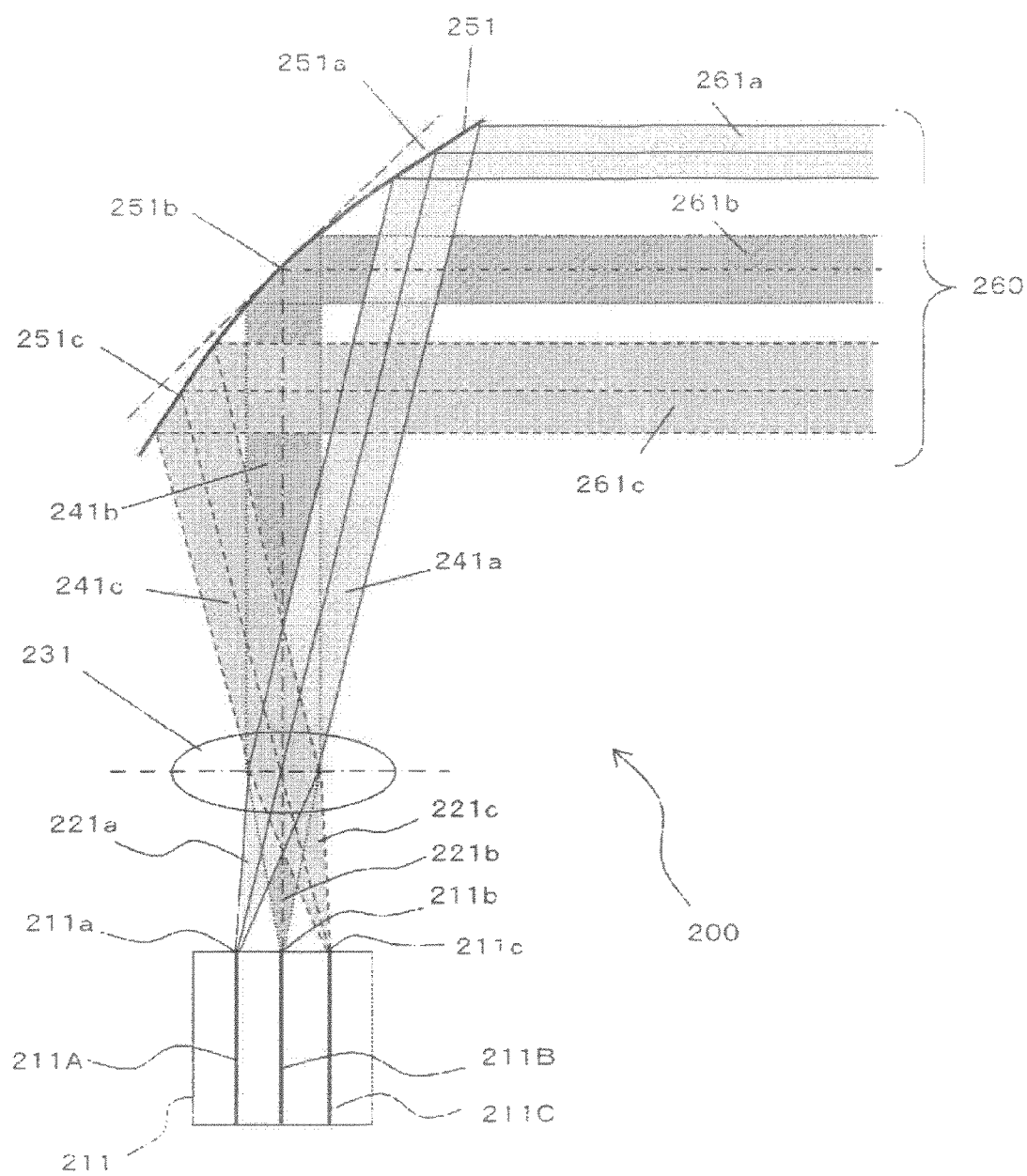
FIG. 10 is a diagram for describing a modification of the light source unit of the first exemplary embodiment.

While in the above-described light source unit, as each of the light sources, the semiconductor light-emitting element, which is the laser array element having the two emitters, is used, the following configuration as shown in FIG. 10 may be employed when a semiconductor light-emitting element having three emitters is used. FIG. 10 illustrates, for simplification, only one light source 211, collimator lens 231, and concave reflecting mirror 251. Respective outgoing beams 221a, 221b, and 221c of three emitters 211a, 211b, and 211c formed at ends of three waveguide 211A, 211B, and 211C of light source 211 are converted to collimated beams (parallel beams) in the same collimator lens. Collimated beams 241a, 241b, and 241c enter concave reflecting mirror 251 to be reflected beams 261a, 261b, and 261c making up luminous flux group 260. At this time, when angles of the respective collimated beams at reflecting points 251a, 251b, and 251c are set so that reflected beams 261a, 261b, and 261c are parallel to one another, the same effects as those when the semiconductor light-emitting elements each having the two emitters, which have been described in the first exemplary embodiment, are used can be obtained. When the number of the emitters is increased to four or more as well, changing the reflection angles at the points where the respective collimated beams are reflected at the reflecting mirror can bring about a plurality of collimated beams having outgoing directions parallel to one another.

As described above, the configuration of the present modification can realize light source unit 200 that has a small size, high output, and high coupling efficiency with the optical system, and further, can efficiently dissipate the heat generation sources to exhaust heat.

In the present exemplary embodiment and the modification thereof, concave reflecting mirrors 151, 152, 153, 251 may be made up of a plurality of planar reflection surfaces, or may be made up of a plurality of concave curved reflection surfaces. When the concave reflecting mirrors are made up of the plurality of concave curved reflection surfaces, since even each of the concave reflecting mirrors produces a lens effect, distances among the light source, the collimator lens, and the concave curved surface may be minutely adjusted to make the beams radiated from the light source unit straight advancing beams.

Second Exemplary Embodiment

Subsequently, referring to FIG. 11, a light source unit of a second exemplary embodiment will be described. The light source unit of the present exemplary embodiment has almost the same configuration as the first exemplary embodiment, and thus, a description will be given, focusing on different portions.

Figure 11:
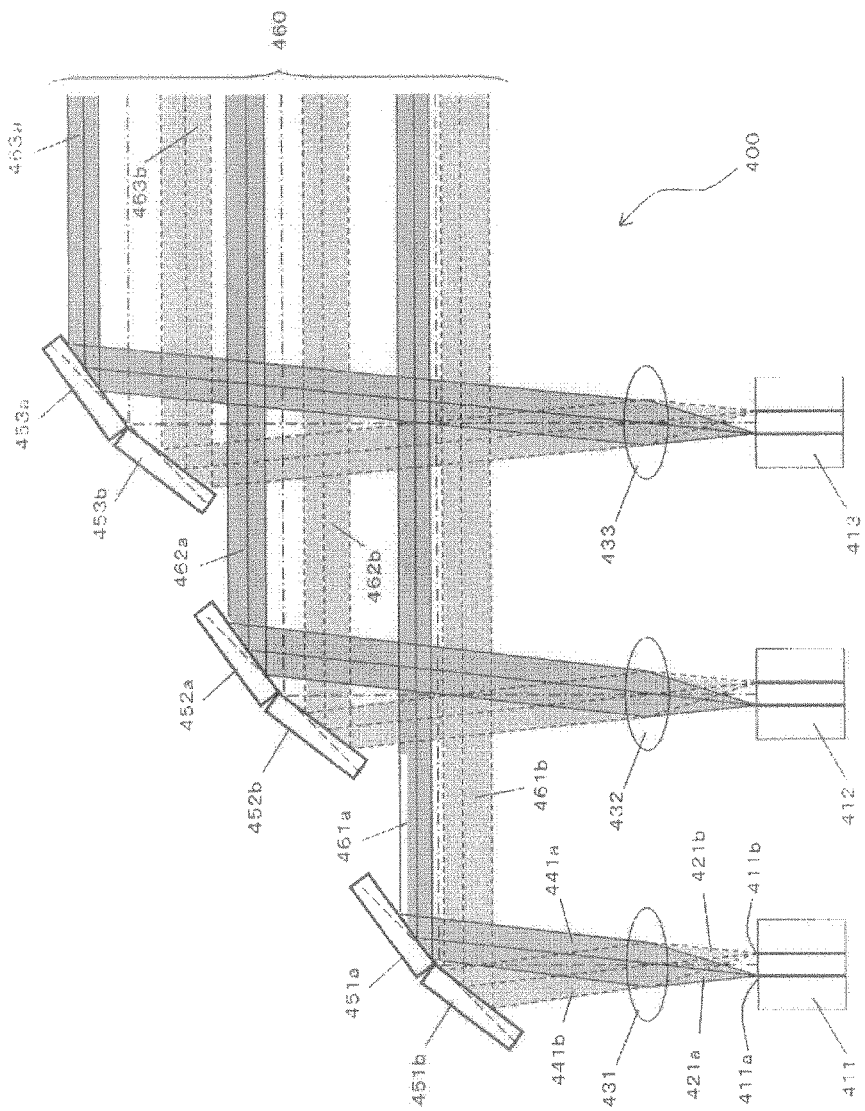
FIG. 11 is a diagram for describing a configuration of a light source unit of a second exemplary embodiment.

FIG. 11 is a configuration diagram of light source unit 400 according to the second exemplary embodiment of the present disclosure. Light source unit 400 is made up of a plurality of light sources 411, 412, and 413, a plurality of collimator lenses 431, 432, and 433, and a plurality of reflecting mirrors 451a, 451b, 452a, 452b, 453a, and 453b. Light source 411 is a laser array element made up of two emitters 411a and 411b.

Outgoing beams 421a and 421b emitted from emitter 411a and 411b each have a certain spread angle. These outgoing beams 421a and 421b are captured by collimator lens 431 to be converted to collimated beams (parallel beams) 441a and 441b, respectively. At this time, outgoing directions of the two collimated beams are not parallel, and have beam deviation angle 2α. The above-described configuration is completely the same as that of the first exemplary embodiment.

Different points of the present exemplary embodiment are in a configuration of the reflecting mirrors. That is, while in the first exemplary embodiment, the one concave mirror is disposed for the one semiconductor light-emitting element and the one collimator lens, in the present exemplary embodiment, the two planar mirrors are disposed. A major feature is that the same plurality of planar mirrors are used and disposed at predetermined angles to thereby constitute an optical system. For example, in the optical unit using the concave mirrors described in the first exemplary embodiment, each of the concave mirrors needs to be designed and manufactured in accordance with beam deviation angle $2\alpha$ decided by the acceptance angle of the collimator lens and the emitter interval of the laser array chip. Thus, when the numerical aperture of the collimator lens, the emitter interval of the light source, and the like are changed, the design of the concave mirror needs to be changed. On the other hand, as for the light source unit described in the present exemplary embodiment, even if the collimator lenses and the light sources are changed, only adjusting positions and angles of reflecting mirrors 451a, 451b, 452a, 452b, 453a, 453b enables collimated beams 461a, 461b, 462a, 462b, 463a, and 463b to be radiated as luminous flux group 460 in which luminous fluxes are parallel to one another.

As described above, the configuration of the present exemplary embodiment can realize the light source unit that has a small size, high output, and high coupling efficiency with the optical system, and further, can distribute the heat generation sources to exhaust heat efficiently.

Third Exemplary Embodiment

Figure 12:
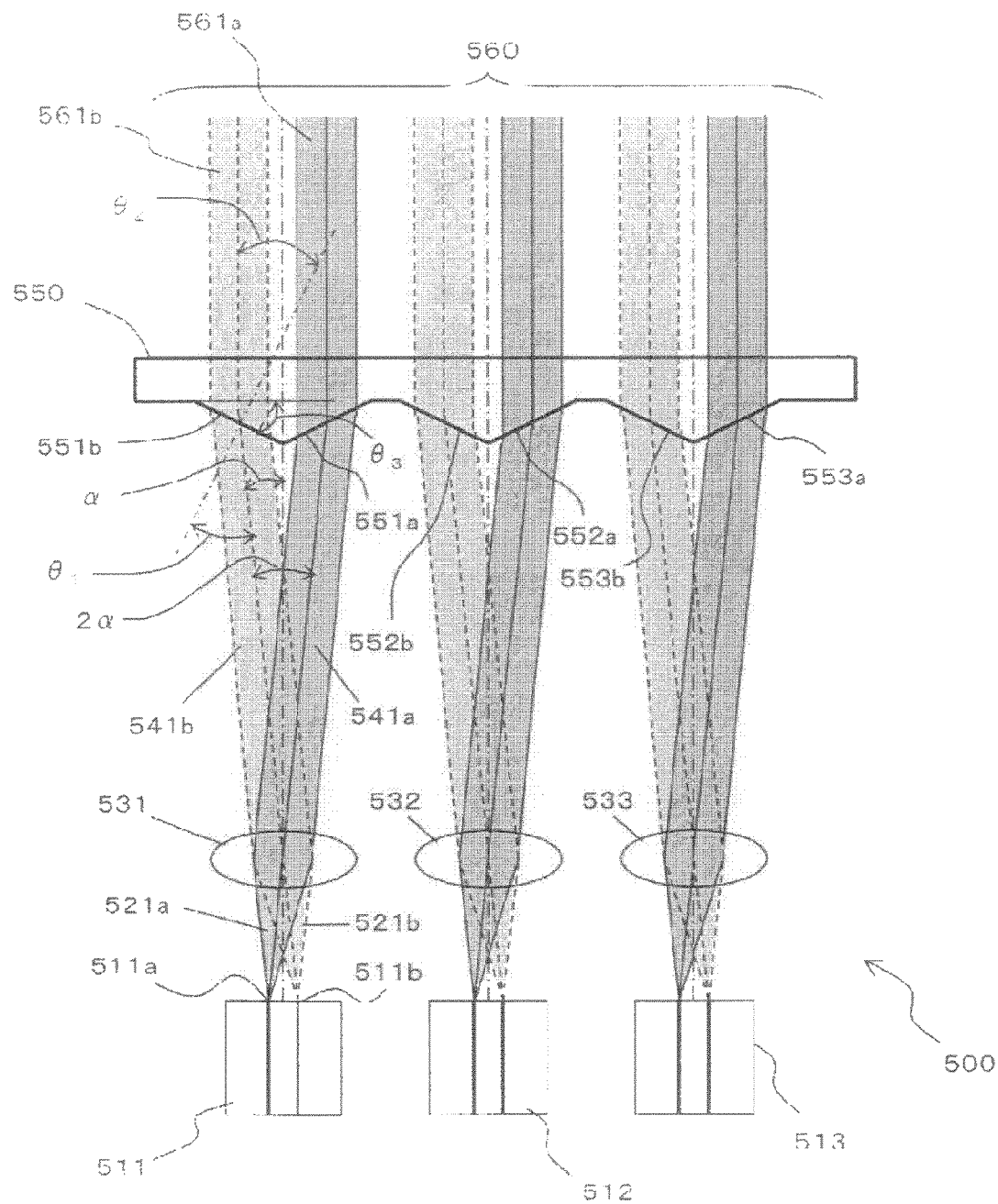
FIG. 12 is a diagram for describing a configuration of a light source unit of a third exemplary embodiment.

In the above-described exemplary embodiment, the light source unit is constituted, using the reflecting mirrors. On the other hand, in the present exemplary embodiment, an optical system utilizing optical refraction in place of the reflecting mirrors is employed. FIG. 12 is a configuration diagram of a light source unit of the present exemplary embodiment according to the present disclosure. Light source unit 500 is made up of a plurality of light sources 511, 512, and 513, a plurality of collimator lenses 531, 532, and 533, and optical element 550. Furthermore, optical element 550 is made up of plurality of optical surfaces 551a, 551b, 552a, 552b, 553a, 553b inclined at $\theta_3$ from a principal surface. Here, light source 511 is focused on. Light source 511 includes two emitters 511a and 511b. Laser beams 521a and 521b radiated from the respective emitters enter collimator lens 531 to be converted to collimated beams 541a and 541b. At this time, outgoing directions of the two collimated beams are not parallel, and have beam deviation angle $2\alpha$, as described above.

Here, collimated beam 541b is focused on. This collimated beam 541b enters optical surface 551b of optical element 550 at incident angle $\theta_1$. Collimated beam 541b propagates backward from the optical element at outgoing angle $\theta_2$ from the optical surface. At this time, a relationship between the incident angle and the outgoing angle of the beam at optical surface 551b follows Snell laws. That is, $$\sin \theta_1 / \sin \theta_2 = n_2/n_1 \quad (3)$$

wherein $n_1$ and $n_2$ are refractive indexes of air and a transparent material used for optical element 550. A value of $\theta_2$ is geometrically expressed by the following expression.

$$\theta_2 = \theta_1 - \alpha \quad (4)$$

In order that the collimated beam refractively passing through optical surface 551b becomes perpendicular to the principal surface of optical element 550, inclination angle $\theta_3$ of optical surface 551b with respect to the principal surface of optical element 550 only needs to be made equal to $\theta_2$.

For example, a case where beam deviation angle $2\alpha$ is 1.8 degrees is considered. When optical element 550 is formed of an optical glass material having a refractive index of 1.5, the collimated beam advances in a direction perpendicular to the principal surface of optical element 550 with $\theta_3$ of about 3.6 degrees.

With regards to collimated beam 541b, by similarly designing optical surface 551a, two collimated beams 561a and 561b radiated as luminous flux group 560 from optical element 550 become luminous fluxes parallel to each other.

Furthermore, when for the other light sources and collimator lenses, optical surfaces are similarly designed and disposed, the luminous fluxes in the luminous flux group emitted from all the light sources making up light source unit 500 become parallel to one another.

While in FIG. 12, light source unit 500 made up of three light sources 511, 512, and 513, three collimator lenses 531, 532, and 533, and optical element 550 is exemplified, even in the case of four or more sets of the light sources and the collimator lenses, the optical surfaces of optical element 550 only need to be added.

As described above, the configuration of the present exemplary embodiment can realize the light source unit that has a small size, high output, and high coupling efficiency with the optical system, and further, can distribute the heat generation sources to exhaust heat efficiently.

Modification of Third Exemplary Embodiment

Figure 13:
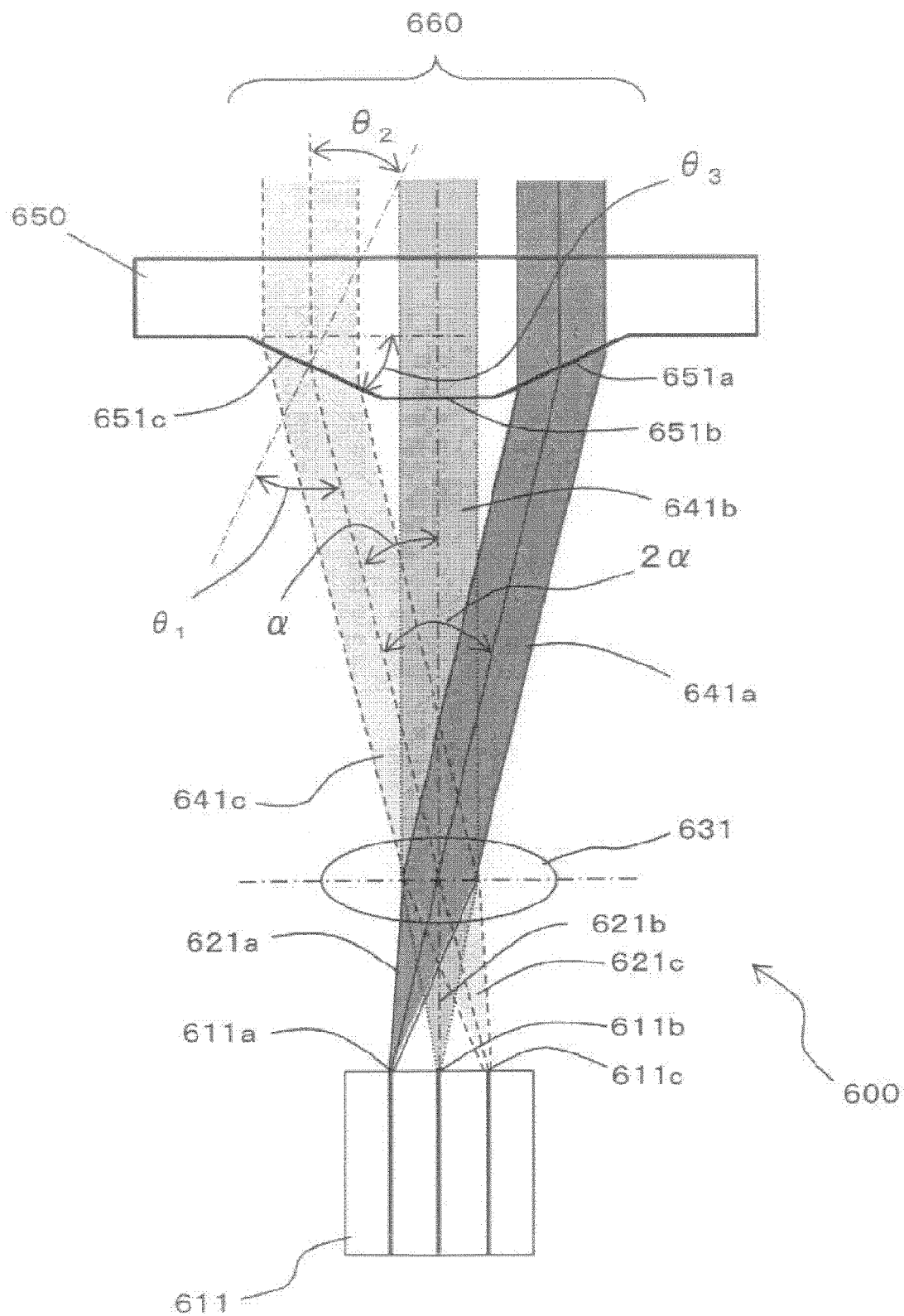
FIG. 13 is a diagram for describing Modification 1 of the light source unit of the third exemplary embodiment.

In the above-described exemplary embodiment, three emitters may be formed in each light source. As a modification in this case, a description will be given referring to light source unit 600 shown in FIG. 13. FIG. 13 illustrates a configuration of a light source unit when one light source 611 is made up of three emitters 611a, 611b, and 611c. While for simplification, only a set of one light source, a collimator lens, and an optical element is illustrated, the light source unit may be made up of a plurality of light sources, a plurality of collimator lenses, and a plurality of optical elements.

Outgoing beams 621a, 621b, and 621c from emitters 611a, 611b, and 611c are converted by collimator lens 631 to collimated beams 641a, 641b, and 641c, respectively.

Optical element 650 is made up of three optical surfaces 651a, 651b, and 651c. These optical surfaces 651a, 651b, and 651c are designed so that collimated beams 641a, 641b, and 641c are parallel to one another. Collimated beams 641a and 641c, which are inclined with respect to a principal surface of optical element 650 to be propagated, enter optical surfaces 651a and 651c, respectively. At this time, optical surfaces 651a and 651c are inclined with respect to the principal surface of optical element 650 at $\theta_3$. A design value of $\theta_3$ at this time is decided, based on a refractive index of optical element 650 and beam deviation angle $2\alpha$ of collimated beams 641a and 641c, as described above. On the other hand, collimated beam 641b is propagated perpendicular to the principal surface of optical element 650. Accordingly, optical surface 651b, which collimated beam 641b enters, only needs to be parallel to the principal surface of optical element 650. As a result, three collimated beams 641a, 641b, and 641c become luminous fluxes parallel to one another, so that luminous flux group 660 is formed.

In the case where the number of emitters is four or more as well, the optical surfaces that the respective collimated beams enter are similarly designed, which can realize collimated luminous flux group of the luminous fluxes parallel to one another.

As described above, the configuration of the present exemplary embodiment can realize the light source unit that has a small size, high output, and high coupling efficiency with the optical system, and further, can d the heat generation sources to exhaust heat efficiently.

Modification 2 of Third Exemplary Embodiment

Figure 14:
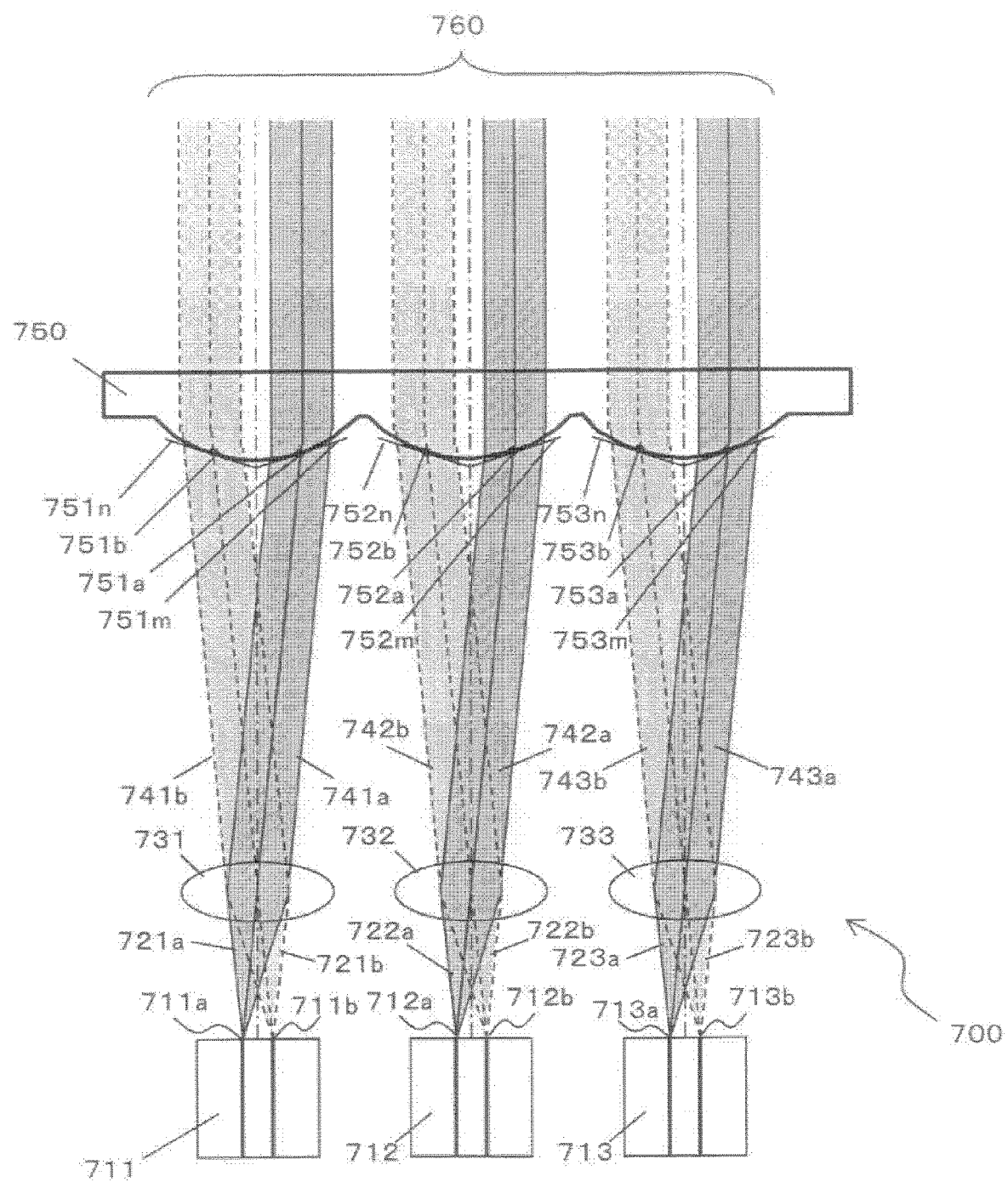
FIG. 14 is a diagram for describing Modification 2 of the light source unit of the third exemplary embodiment.

In the above-described exemplary embodiment, the optical element having the plurality of optical surfaces each made of a plane is used. This is extended, and an optical element using optical surfaces each made up of a curved surface can be employed. An exemplary embodiment in the case where the optical element having the optical surfaces each made of the curved surface is used will be described referring to optical unit 700 in FIG. 14.

Light source 711 as a semiconductor light-emitting element has two emitters 711a and 711b. Light sources 712 and 713 similarly have emitters 712a, 712b, 713a, and 713b. Outgoing beams 721a, 721b, 722a, 722b, 723a, and 723b from the respective emitters are all converted to collimated beams 741a, 741b, 742a 742b, 743a, and 743b by collimator lenses 731, 732, and 733, respectively. A basic configuration of the foregoing optical system is completely the same as the configuration shown in FIG. 12. A different point from the configuration in FIG. 12 is that the optical surface of optical element 750 is made of a curved surface.

When collimated beam 741b enters optical element 750, an incident point thereof is defined as optical point 751b. When an angle formed by a principal surface of optical element 750 and tangent 751n with respect to a curved surface at this optical point 751b is designed by the above-described method, a propagation direction of collimated beam 741b can be made perpendicular to the principal surface of optical element 750. On the other hand, similarly designing optical point 751a and tangent 751m can make collimated beams 741a and 741b parallel to each other. Other collimated beams 742a, 742b, 743a, and 743b, and optical points 752a, 752b, 753a, and 753b, and tangents 752m, 752n, 753m, and 753n are similarly designed, so that luminous flux group 760 made of luminous fluxes parallel to one another can be formed.

As described above, the configuration of the present exemplary embodiment can realize the light source unit that has a small size, high output, and high coupling efficiency with the optical system, and further, can distribute the heat generation sources to exhaust heat efficiently.

Fourth Exemplary Embodiment

Figure 15:
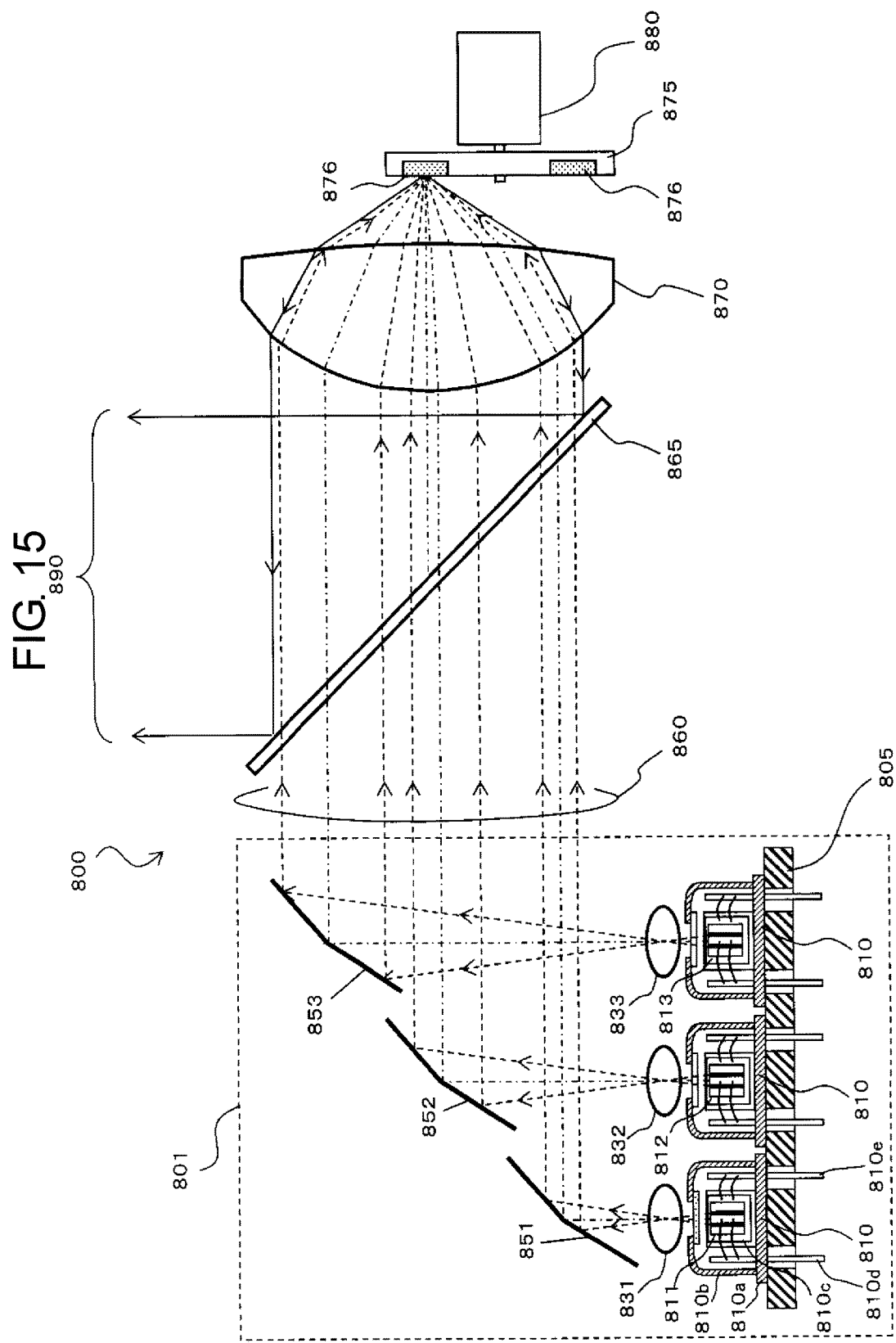
FIG. 15 is a schematic diagram for describing a light source module of a fourth exemplary embodiment.

Next, a light source module in which a light source unit and a phosphor are combined will be described as a fourth exemplary embodiment according to the present disclosure. FIG. 15 is a schematic diagram of light source module 800 of the fourth exemplary embodiment. Light source module 800 is made up of light source unit 801, dichroic mirror 865, condensing lens 870, rotating plate 875 with phosphor layers 876, and direct current (DC) motor 880.

Light source unit 801 basically has the same configuration as the light source unit described in the first exemplary embodiment, and a more specific exemplary embodiment will be described. That is, light source unit 801 is made up of a plurality of light sources 811, 812, and 813 each having two emitters, a plurality of collimator lenses 831, 832, and 833, and concave reflecting mirrors 851, 852, and 853.

Here, light sources 811, 812, and 813 are each a semiconductor laser element that generates laser beams having a wavelength around 405 nm, and are mounted on package 810. Specifically, light sources 811, 812, 813 are each mounted through sub-mount 810c on a post formed on metal base 810a made of iron, copper or the like. In metal base 810a, lead wires 810d, 810e to electrically connect each of light sources 811, 812, 813 and an outside are formed. Moreover, cap 810b is fixed and hermetically sealed to metal base 810a so as to cover each of light sources 811, 812, 813. Moreover, cap 810b is formed with a translucent window having a thickness of, for example, 0.2 mm to 0.3 mm, and outgoing beams radiated from each of light sources 811, 812, 813 enter each of collimator lenses 831, 832, 833 without any optical loss. Furthermore, heat generated in light sources 811, 812, 813 is transmitted to heat sinks 805 made of a metal or an alloy of iron, aluminum, copper or the like through sub-mounts 810c and packages 810 to be effectively released to the outside from light source unit 801. In this case, light sources 811, 812, 813 each have a plurality of emitters, as described before. Thus, the heat generated in the waveguides and the emitters of light sources 811, 812, 813 is effectively exhausted to the packages, which can reduce a junction temperature. Luminous flux group 860 radiated from light source unit 801 is emitted as a plurality of luminous fluxes parallel to one another. Thus, the luminous flux group is radiated as light in which a size of the luminous fluxes is small, and that has high coupling efficiency with the optical system at a subsequent stage. Luminous flux group 860 is schematically indicated by dashed arrows in FIG. 15.

This luminous flux group 860 passes through dichroic mirror 865 and condensing lens 870 to be condensed on phosphor layer 876 on rotating plate 875. Here, dichroic mirror 865 is a reflecting mirror having wavelength selectivity, and disposed dichroic mirror 865 has a property of transmitting beams having a wavelength shorter than 420 nm, and reflecting beams having a wavelength longer than 420 nm. Accordingly, luminous flux group 860 having a wavelength of 405 nm is transmitted through this dichroic mirror 865.

Rotating plate 875 is formed with phosphor layers 876 each obtained by mixing a phosphor such as, for example, a Ce-activated $Y_3(Ga, Al)_5O_{12}$ phosphor and an Eu-activated β-SiAlON phosphor with a binder such as glass and the like. Here, beside the configuration in which one type of phosphor layer 876 is formed, phosphor layers 876 may be formed by allocating, to respective predetermined regions, phosphor layers made up of three types of phosphors that radiate fluorescences in three primary colors of light, that is, blue (a center wavelength: 420 nm to 500 nm), green (a center wavelength: 500 nm to 590 nm) and red (a center wavelength: 590 nm to 660 nm) fluorescences.

Luminous flux group 860 condensed by condensing lens 870 is directed to rotating plate 875 with these phosphor layers to excite the phosphor and generate the fluorescence. Rotating plate 875 with the phosphor layers is rotated by DC motor 880, and luminous flux group 860 is continuously directed to phosphor layers 876 to suppress deterioration of phosphor layers 876.

Luminous flux group 890 made of the fluorescence generated in phosphor layers 876 (schematically indicated by solid arrows in FIG. 15) passes through condensing lens 870 to reach dichroic mirror 865. Since dichroic mirror 865 used in this case reflects the light having a wavelength longer than 420 nm, as described before, luminous flux group 890 is reflected at dichroic mirror 865 and is radiated to an outside of light source module 800.

The above-described configuration enables the beams of luminous flux group 860 to be converted to luminous flux group 890 made of the beams of a different spectrum by the phosphor and be efficiently emitted from light source module 800. At this time, luminous flux group 860, being made of the parallel luminous fluxes, can efficiently enter condensing lens 870 to be condensed in fine regions of phosphor layers 876. This enables the fluorescence having small etendue to be emitted from phosphor layers 876. Accordingly, the fluorescence having high optical output can be easily converted to the parallel beams in the condensing lens 870. That is, the light source module capable of efficiently radiating the luminous flux group made of the fluorescence having high straight advance properties, using condensing lens 870 and dichroic mirror 865 can be realized.

When the three types phosphors in blue, green and red are formed in the respective regions on rotating plate 875, the respective colors of blue, green and red can be radiated from the light source module in a time-division manner. That is, when control of the optical output emitted from light source unit 801 and the rotation of rotating plate 875 with the phosphors are synchronized, an arbitrary color including white can be formed.

Furthermore, although not illustrated, directing reflected luminous flux group 890 to an image formation device such as a digital micro-mirror device (DMD) allows a projection type image display device (projector device) to be easily formed.

While in the present exemplary embodiment, as light source unit 801, the light source unit using the concave reflecting mirrors described in the first exemplary embodiment is used, the light source unit using the planar reflecting mirrors described in the second exemplary embodiment, and the light source unit using the optical element described in the third exemplary embodiment may be used. The luminous flux group emitted from light source unit 801 only needs to be a collimated luminous flux group in which the luminous fluxes are collimated to one another. Moreover, while in the present exemplary embodiment, the three semiconductor light-emitting elements are used, the number thereof can be increased to form a light source module having higher luminance.

In the present exemplary embodiment, semiconductor laser arrays are used in each of which the semiconductor light-emitting element has a plurality of emitters. As compared with a semiconductor laser having only a single emitter, the optical output obtained from one semiconductor light-emitting element is higher. Thus, higher optical output can be obtained with fewer semiconductor light-emitting elements. As a result, the small light source module having high luminance can be constituted.

Fifth Exemplary Embodiment

Figure 16:
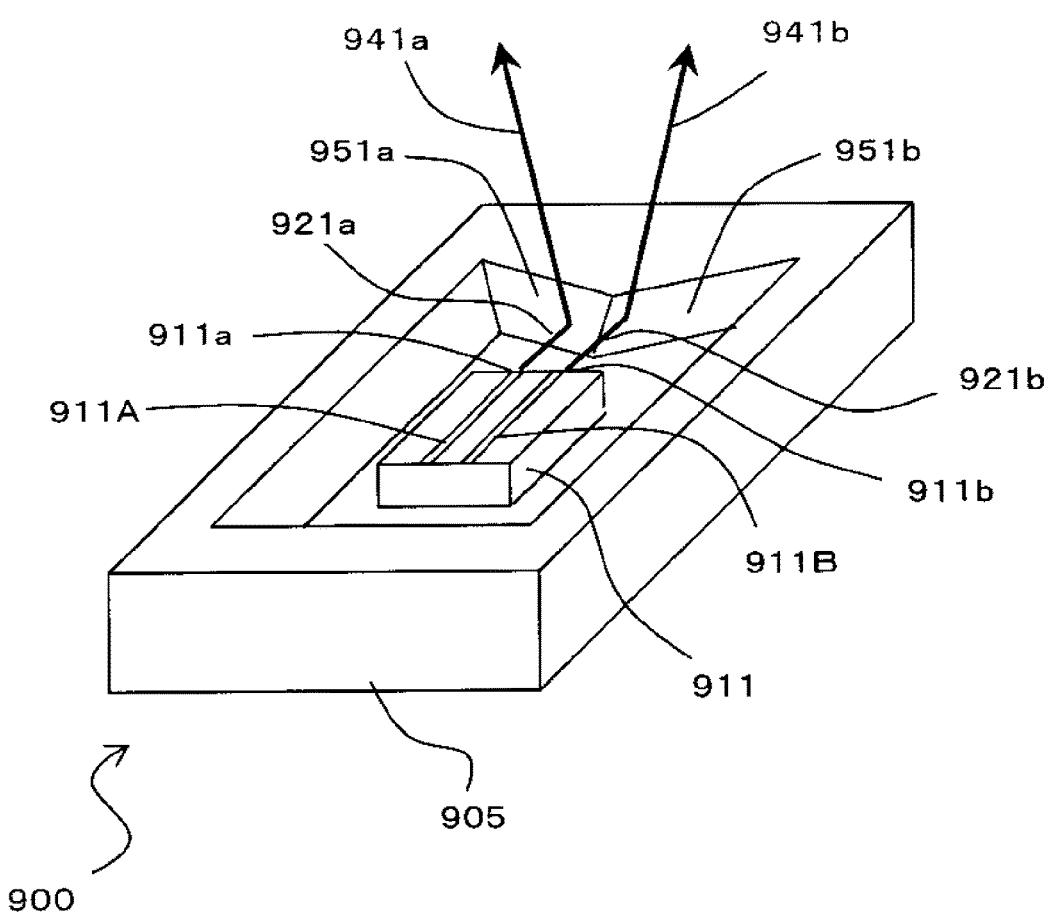
FIG. 16 is a diagram for describing a light source unit of a fifth exemplary embodiment.
Figure 17:
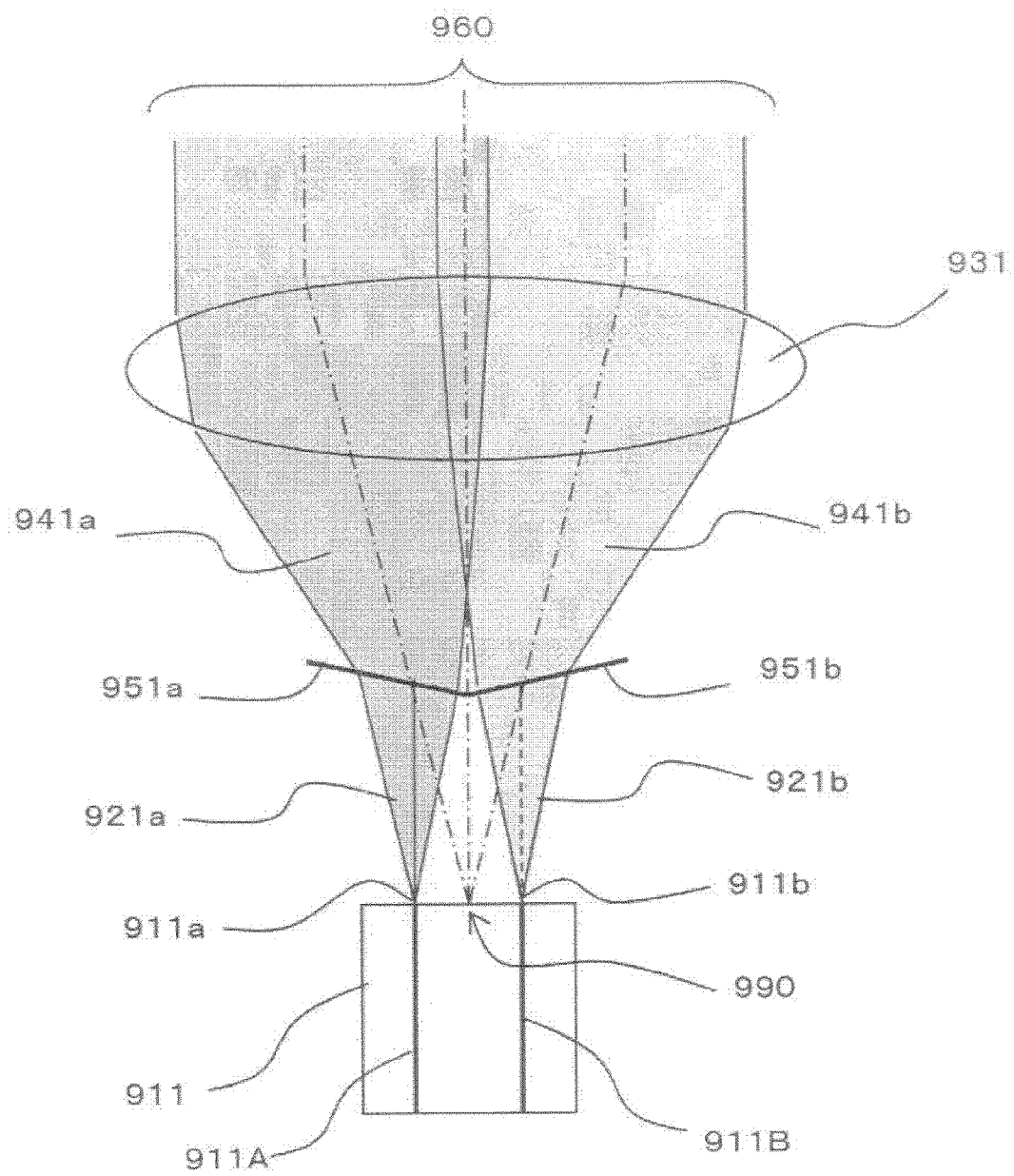
FIG. 17 is a diagram for describing the light source unit of the fifth exemplary embodiment.
Figure 18:
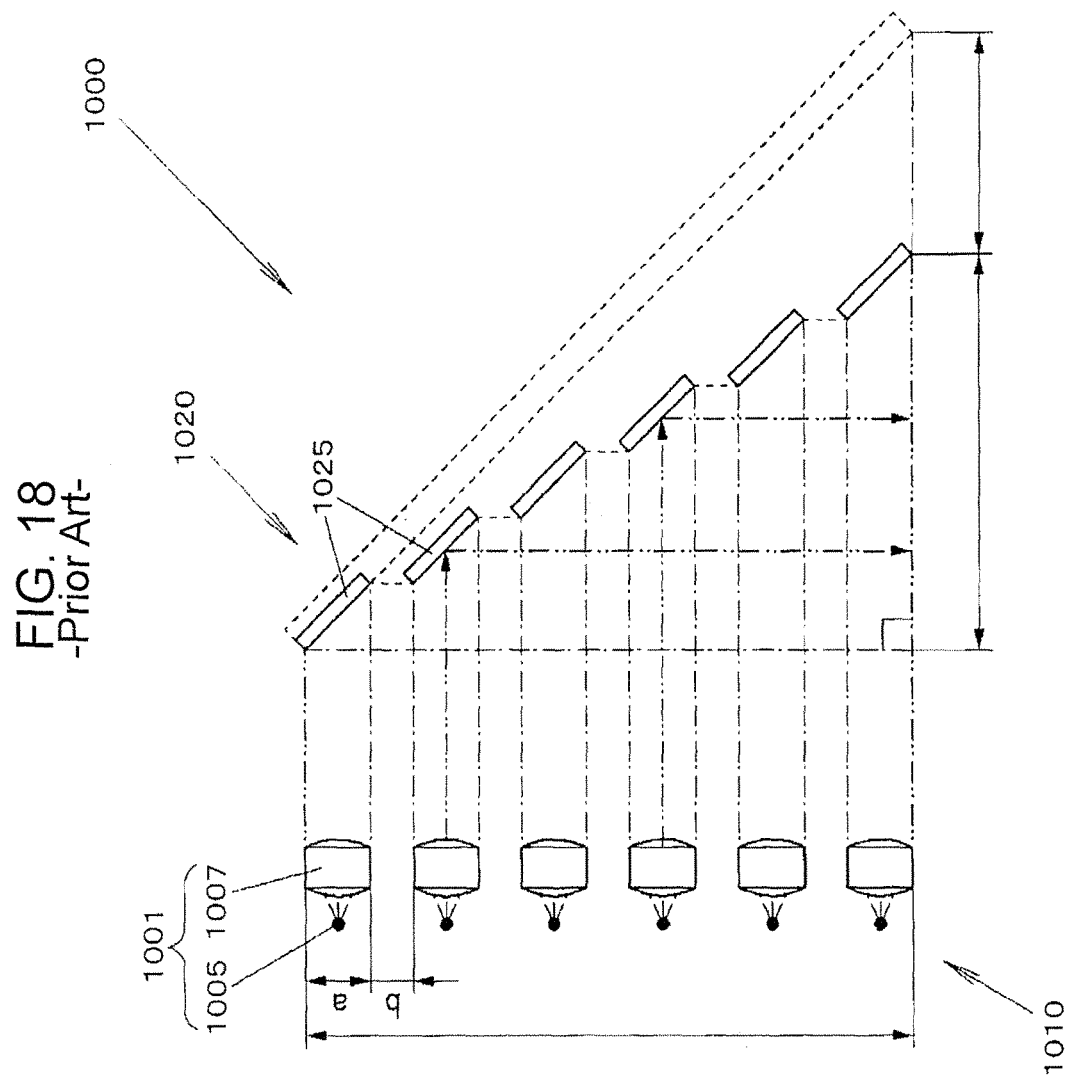
FIG. 18 is a diagram for describing a conventional light source unit.

Subsequently, a light source unit of a fifth exemplary embodiment according to the present disclosure will be described with reference to FIGS. 16 and 17. FIG. 16 is a schematic perspective diagram of light source unit 900 of the present exemplary embodiment. FIG. 17 is a diagram for describing functions of light source unit 900 of the present exemplary embodiment.

Light source unit 900 is formed with first waveguide 911A and second waveguide 911B on a substrate, and light source 911, which is a semiconductor light-emitting element, such as a laser array element and the like, that radiates outgoing beams having high directivity from first emitter 911a and second emitter 911b, is mounted on package 905. In package 905, first reflecting mirror 951a and second reflecting mirror 951b are formed. Outgoing beams 921a, 921b emitted from first emitter 911a and second emitter 911b of light source 911 are reflected by first reflecting mirror 951a and second reflecting mirror 951b in perpendicular directions and emitted from light source unit 900 as outgoing beams 941a, 941b. At this time, first reflecting mirror 951a and second reflecting mirror 951b are set so as to each have a minute angle.

In the above-described configuration, as shown in FIG. 17, apparent light-emitting points of outgoing beams 941a, 941b reflected by first reflecting mirror 951a and second reflecting mirror 951b are set to be same light-emitting point 990. This configuration enables the beams to be radiated as luminous flux group 960, which is made up of parallel outgoing beams, by collimator lens 931 set on a principal axis of outgoing beams 941a, 941b.

As described above, the configuration of the present exemplary embodiment can realize the light source, the light source unit, and the projection type image display device that have small sizes, high output, and high coupling efficiency with the optical system, and further, can distribute the heat generation sources to exhaust heat efficiently.

While in the first to fifth exemplary embodiments, the emitted light central wavelength of each of the light sources as the semiconductor light-emitting elements is set to about 405 nm, the present disclosure is not limited thereto. For example, any semiconductor light-emitting element having a nitride semiconductor material can be used as a blue light source with the emitted light central wavelength set to a range of 420 nm to 500 nm, or can be used as a green light source with the central wavelength set to a range of 490 nm to 550 nm. Moreover, using a gallium-arsenide based semiconductor material allows the semiconductor light-emitting element to be used as a red light source having central wavelength of 550 nm to 700 nm, or to be used as an infrared source having a longer wavelength.

The light source, the light source unit, and the light source module of the present disclosure are useful as a light source of a device requiring relatively high optical output including an image display device such as a laser display and a projector, industrial laser equipment for laser machining, laser annealing and the like, and so on.

What is claimed is:

1. A light source unit comprising:
   a light source having a plurality of light-emitting points, and configured to radiate outgoing beams in an identical direction and with a predetermined spread angle from the respective plurality of light-emitting points;
   a collimator lens configured to transmit the outgoing beams; and
   an optical element including incident surfaces for the respective plurality of outgoing beams and having different inclination angles with respect to a principal surface.

2. The light source unit according to claim 1, wherein the incident surfaces are inclined to the light source with respect to the principal surface.

3. The light source unit according to claim 2, wherein optical axes of the plurality of outgoing beams have a predetermined angle difference after the plurality of outgoing beams pass through the lens, and
   the inclination angles are half of the predetermined angle difference.

4. The light source unit according to claim 1, wherein the principal surface has an angle of 45 degrees with respect to the optical axes, and the plurality of incident surfaces reflect the outgoing beams.

5. The light source unit according to claim 1, wherein the optical element has a plurality of mirrors each including the incident surface.

6. The light source unit according to claim 1, wherein
the optical element transmits the outgoing beams, and
the incident surfaces are inclined so as to be convex to the optical element with respect to the principal surface.

7. The light source unit according to claim 6, wherein
the principal surface is perpendicular to the optical axes, and
the plurality of incident surfaces transmit the outgoing beams.

8. The light source unit according to claim 1, wherein
the light source radiates three outgoing beams including a first outgoing beam, a second outgoing beam, and a third outgoing beam aligned in a row,
the optical element has a first incident surface, a second incident surface, and a third incident surface for the first outgoing beam, the second outgoing beam, and the third outgoing beam, respectively, and
the second incident surface coincides with the principal surface, and the first incident surface and the third incident surface have a predetermined inclination angle with respect to the principal surface.

9. The light source unit according to claim 6, wherein the optical element is a lens.

10. The light source unit according to claim 1 further comprising a package in which the optical element is mounted,
wherein the incident surfaces are included in the package.

11. The light source unit according to claim 1, wherein the light source is a semiconductor laser array.

12. A light source module comprising:
the light source unit according to claim 1; and
a phosphor,
wherein the outgoing beams radiated from the light source unit are directed to the phosphor.

13. The light source unit according to claim 1,
wherein an interval between each of the light-emitting points is 20 μm or more and 120 μm or less.

14. The light source unit according to claim 13, wherein the light source is a nitride semiconductor laser array.

* * * * *